(12) United States Patent
Bauer et al.

(10) Patent No.: US 8,367,528 B2
(45) Date of Patent: Feb. 5, 2013

(54) CYCLICAL EPITAXIAL DEPOSITION AND ETCH

(75) Inventors: Matthias Bauer, Phoenix, AZ (US); Shawn G. Thomas, Gilbert, AZ (US)

(73) Assignee: ASM America, Inc., Phoenix, AZ (US)

( * ) Notice: Subject to any disclaimer, the term of this patent is extended or adjusted under 35 U.S.C. 154(b) by 472 days.

(21) Appl. No.: 12/620,488

(22) Filed: Nov. 17, 2009

(65) Prior Publication Data
US 2011/0117732 A1     May 19, 2011

(51) Int. Cl.
*H01L 21/20*     (2006.01)
(52) U.S. Cl. ........ 438/507; 438/300; 438/301; 438/149; 438/767; 257/E21.131; 257/E21.219
(58) Field of Classification Search ............... 438/507, 438/300, 301, 149, 767; 257/E21.131, E21.219
See application file for complete search history.

(56) References Cited

U.S. PATENT DOCUMENTS

| | | | |
|---|---|---|---|
| 4,058,430 A | 11/1977 | Suntola et al. | |
| 4,210,925 A | 7/1980 | Morcom et al. | |
| 4,413,022 A | 11/1983 | Suntola et al. | |
| 4,521,952 A | 6/1985 | Riseman | |
| 4,578,142 A | 3/1986 | Corboy, Jr. et al. | |
| 4,605,947 A | 8/1986 | Price et al. | |
| 4,698,316 A | 10/1987 | Corboy, Jr. et al. | |
| 4,704,186 A | 11/1987 | Jastrzebski | |
| 4,710,241 A | 12/1987 | Komatsu | |
| 4,728,623 A | 3/1988 | Lu | |
| 4,735,918 A | 4/1988 | Parsons | |
| 4,747,367 A | 5/1988 | Posa | |
| 4,749,440 A | 6/1988 | Blackwood et al. | |
| 4,749,441 A | 6/1988 | Christenson | |
| 4,758,531 A | 7/1988 | Beyer | |
| 4,761,269 A | 8/1988 | Conger et al. | |
| 4,778,775 A | 10/1988 | Tzeng | |
| 4,786,615 A | 11/1988 | Liaw | |
| 4,793,872 A | 12/1988 | Meunier | |
| 4,834,809 A | 5/1989 | Kakihara | |

(Continued)

FOREIGN PATENT DOCUMENTS

| | | |
|---|---|---|
| DE | 19820147 | 7/1999 |
| JP | 59004040 | 1/1984 |

(Continued)

OTHER PUBLICATIONS

Aoyama et al., "Segregation of Interface Carbon Druing Silicon Epitaxial Growth by UHV-CVD", Journal of Crystal Growth, 1995, vol. 157, pp. 323-326.

(Continued)

*Primary Examiner* — Thinh T Nguyen
(74) *Attorney, Agent, or Firm* — Knobbe, Martens, Olson & Bear LLP

(57) ABSTRACT

Methods for selectively depositing high quality epitaxial material include introducing pulses of a silicon-source containing vapor while maintaining a continuous etchant flow. Epitaxial material is deposited on areas of a substrate, such as source and drain recesses. Between pulses, the etchant flow continues such that lower quality epitaxial material may be removed, as well as any non-epitaxial material that may have been deposited. The pulse of silicon-source containing vapor may be repeated until a desired thickness of epitaxial material is selectively achieved in semiconductor windows, such as recessed source/drain regions.

15 Claims, 8 Drawing Sheets

U.S. PATENT DOCUMENTS

| | | |
|---|---|---|
| 4,857,479 A | 8/1989 | McLaughlin |
| 4,870,030 A | 9/1989 | Markunas et al. |
| 4,873,205 A | 10/1989 | Critchlow |
| 4,891,092 A | 1/1990 | Jastrzebski |
| 4,897,366 A | 1/1990 | Smeltzer |
| 4,923,826 A | 5/1990 | Jastrzebski |
| 4,966,861 A | 10/1990 | Mieno |
| 4,981,811 A | 1/1991 | Feygenson |
| 4,994,402 A | 2/1991 | Chiu |
| 5,004,705 A | 4/1991 | Blackstone |
| 5,011,789 A | 4/1991 | Burns |
| 5,028,973 A | 7/1991 | Bajor |
| 5,032,233 A | 7/1991 | Yu et al. |
| 5,037,775 A | 8/1991 | Reisman |
| 5,043,300 A | 8/1991 | Nulman |
| 5,045,494 A | 9/1991 | Choi |
| 5,059,544 A | 10/1991 | Burghartz |
| 5,061,644 A | 10/1991 | Yue |
| 5,061,655 A | 10/1991 | Ipposhi |
| 5,071,670 A | 12/1991 | Kelly |
| 5,084,406 A | 1/1992 | Rhodes et al. |
| 5,094,977 A | 3/1992 | Yu et al. |
| 5,112,439 A | 5/1992 | Reisman et al. |
| 5,129,958 A | 7/1992 | Nagashima et al. |
| 5,144,376 A | 9/1992 | Kweon |
| 5,146,304 A | 9/1992 | Yue |
| 5,147,819 A | 9/1992 | Yu et al. |
| 5,148,604 A | 9/1992 | Bantien |
| 5,158,644 A | 10/1992 | Cheung et al. |
| 5,164,813 A | 11/1992 | Blackstone |
| 5,175,121 A | 12/1992 | Choi et al. |
| 5,182,619 A | 1/1993 | Pfiester |
| 5,187,122 A | 2/1993 | Bonis |
| 5,196,360 A | 3/1993 | Doan et al. |
| 5,201,995 A | 4/1993 | Reisman et al. |
| 5,211,796 A | 5/1993 | Hansen |
| 5,225,032 A | 7/1993 | Golecki |
| 5,231,056 A | 7/1993 | Sandhu |
| 5,234,857 A | 8/1993 | Kim et al. |
| 5,236,546 A | 8/1993 | Mizutani |
| 5,236,865 A | 8/1993 | Sandhu et al. |
| 5,252,841 A | 10/1993 | Wen et al. |
| 5,269,876 A | 12/1993 | Mizutani |
| 5,278,098 A | 1/1994 | Wei et al. |
| 5,282,926 A | 2/1994 | Trah et al. |
| 5,285,089 A | 2/1994 | Das |
| 5,306,666 A | 4/1994 | Izumi |
| 5,319,220 A | 6/1994 | Suzuki et al. |
| 5,323,032 A | 6/1994 | Sato et al. |
| 5,324,679 A | 6/1994 | Kim et al. |
| 5,326,992 A | 7/1994 | Yoder |
| 5,341,016 A | 8/1994 | Prall et al. |
| 5,356,510 A | 10/1994 | Pribat et al. |
| 5,360,986 A | 11/1994 | Candelaria |
| 5,373,806 A | 12/1994 | Logar |
| 5,378,641 A | 1/1995 | Cheffings |
| 5,378,901 A | 1/1995 | Nii |
| 5,380,370 A | 1/1995 | Niino et al. |
| 5,389,575 A | 2/1995 | Chin et al. |
| 5,403,434 A | 4/1995 | Moslehi |
| 5,403,751 A | 4/1995 | Nishinda et al. |
| 5,416,354 A | 5/1995 | Blackstone |
| 5,421,957 A | 6/1995 | Carlson et al. |
| 5,422,302 A | 6/1995 | Yonehara et al. |
| 5,422,502 A | 6/1995 | Kovacic |
| 5,425,842 A | 6/1995 | Zijlstra |
| 5,470,799 A | 11/1995 | Itoh et al. |
| 5,480,814 A | 1/1996 | Wuu et al. |
| 5,496,745 A | 3/1996 | Ryum et al. |
| 5,508,212 A | 4/1996 | Wang et al. |
| 5,508,536 A | 4/1996 | Twynam et al. |
| 5,512,772 A | 4/1996 | Maeda et al. |
| 5,517,943 A | 5/1996 | Takahashi |
| 5,549,675 A | 8/1996 | Neuenfeldt et al. |
| 5,557,117 A | 9/1996 | Matsuoka et al. |
| 5,557,118 A | 9/1996 | Hashimoto |
| 5,563,085 A | 10/1996 | Kohyama |
| 5,591,492 A | 1/1997 | Hirai et al. |
| 5,609,721 A | 3/1997 | Tsukune et al. |
| 5,656,519 A | 8/1997 | Mogami |
| 5,656,546 A | 8/1997 | Chen et al. |
| 5,670,404 A | 9/1997 | Dai |
| 5,670,801 A | 9/1997 | Nakano |
| 5,674,781 A | 10/1997 | Huang et al. |
| 5,683,922 A | 11/1997 | Jeng et al. |
| 5,693,147 A | 12/1997 | Ward et al. |
| 5,711,811 A | 1/1998 | Suntola |
| 5,729,033 A | 3/1998 | Hafizi |
| 5,756,394 A | 5/1998 | Manning |
| 5,766,999 A | 6/1998 | Sato |
| 5,769,950 A | 6/1998 | Takasu et al. |
| 5,783,495 A | 7/1998 | Li et al. |
| 5,798,278 A | 8/1998 | Chan et al. |
| 5,831,335 A | 11/1998 | Miyamoto |
| 5,837,580 A | 11/1998 | Thakur et al. |
| 5,856,237 A | 1/1999 | Ku |
| 5,859,447 A | 1/1999 | Yang et al. |
| 5,879,459 A | 3/1999 | Gadgil et al. |
| 5,888,903 A | 3/1999 | O'Brien et al. |
| 5,899,752 A | 5/1999 | Hey et al. |
| 5,904,565 A | 5/1999 | Nguyen et al. |
| 5,916,365 A | 6/1999 | Sherman |
| 5,926,743 A | 7/1999 | Xi et al. |
| 5,933,761 A | 8/1999 | Lee |
| 5,945,350 A | 8/1999 | Violette et al. |
| 5,967,794 A | 10/1999 | Kodama |
| 5,986,287 A | 11/1999 | Eberl et al. |
| 5,998,305 A | 12/1999 | Holmer et al. |
| 6,031,255 A | 2/2000 | Delage et al. |
| 6,037,258 A | 3/2000 | Liu et al. |
| 6,042,654 A | 3/2000 | Comita et al. |
| 6,043,519 A | 3/2000 | Shealy et al. |
| 6,048,790 A | 4/2000 | Iacoponi et al. |
| 6,049,098 A | 4/2000 | Sato |
| 6,057,200 A | 5/2000 | Prall et al. |
| 6,058,945 A | 5/2000 | Fujiyama et al. |
| 6,060,397 A | 5/2000 | Seamons et al. |
| 6,069,068 A | 5/2000 | Rathore et al. |
| 6,074,478 A | 6/2000 | Oguro |
| 6,077,775 A | 6/2000 | Stumborg et al. |
| 6,083,818 A | 7/2000 | Stumborg et al. |
| 6,093,368 A | 7/2000 | Rafferty et al. |
| 6,093,638 A | 7/2000 | Cho |
| 6,100,184 A | 8/2000 | Zhao et al. |
| 6,117,761 A | 9/2000 | Manning |
| 6,139,700 A | 10/2000 | Kang et al. |
| 6,146,517 A | 11/2000 | Hoinkis |
| 6,147,405 A | 11/2000 | Hu |
| 6,153,010 A | 11/2000 | Kiyoku et al. |
| 6,159,828 A | 12/2000 | Ping et al. |
| 6,164,295 A | 12/2000 | Ui et al. |
| 6,181,012 B1 | 1/2001 | Edelstein et al. |
| 6,183,565 B1 | 2/2001 | Granneman et al. |
| 6,184,128 B1 | 2/2001 | Wang et al. |
| 6,188,134 B1 | 2/2001 | Stumborg et al. |
| 6,190,453 B1 | 2/2001 | Boydston et al. |
| 6,190,976 B1 | 2/2001 | Shishiguchi et al. |
| 6,197,666 B1 | 3/2001 | Schafer et al. |
| 6,197,669 B1 | 3/2001 | Twu et al. |
| 6,200,893 B1 | 3/2001 | Sneh |
| 6,203,613 B1 | 3/2001 | Gates et al. |
| 6,207,487 B1 | 3/2001 | Kim et al. |
| 6,207,567 B1 | 3/2001 | Wang et al. |
| 6,221,168 B1 | 4/2001 | Carter et al. |
| 6,225,213 B1 | 5/2001 | Urabe |
| 6,225,650 B1 | 5/2001 | Tadatomo et al. |
| 6,232,196 B1 | 5/2001 | Raaijmakers et al. |
| 6,235,568 B1 | 5/2001 | Murthy et al. |
| 6,270,572 B1 | 8/2001 | Kim et al. |
| 6,277,735 B1 | 8/2001 | Matsubara |
| 6,287,965 B1 | 9/2001 | Kang et al. |
| 6,291,876 B1 | 9/2001 | Stumborg et al. |
| 6,303,523 B2 | 10/2001 | Cheung et al. |
| 6,316,795 B1 | 11/2001 | Croke, III |
| 6,335,251 B2 | 1/2002 | Miyano et al. |
| 6,340,619 B1 | 1/2002 | Ko |
| 6,342,448 B1 | 1/2002 | Lin et al. |

| | | |
|---|---|---|
| 6,343,183 B1 | 1/2002 | Halpin et al. |
| 6,345,150 B1 | 2/2002 | Yoo |
| 6,348,096 B1 | 2/2002 | Sunakawa et al. |
| 6,348,098 B1 | 2/2002 | McLoughlin et al. |
| 6,351,039 B1 | 2/2002 | Jin et al. |
| 6,358,829 B2 | 3/2002 | Yoon et al. |
| 6,365,453 B1 | 4/2002 | DeBoer et al. |
| 6,368,954 B1 | 4/2002 | Lopatin et al. |
| 6,372,584 B1 | 4/2002 | Yu |
| 6,376,318 B1 | 4/2002 | Lee et al. |
| 6,380,065 B1 | 4/2002 | Komai et al. |
| 6,391,785 B1 | 5/2002 | Satta et al. |
| 6,391,796 B1 | 5/2002 | Akiyama et al. |
| 6,437,071 B1 | 8/2002 | Odaka et al. |
| 6,444,495 B1 | 9/2002 | Leung et al. |
| 6,454,854 B1 | 9/2002 | Ose |
| 6,455,935 B1 | 9/2002 | Hu |
| 6,462,411 B1 | 10/2002 | Watanabe et al. |
| 6,482,733 B2 | 11/2002 | Raaijmakers et al. |
| 6,486,018 B2 | 11/2002 | Roberts et al. |
| 6,524,953 B1 | 2/2003 | Hu |
| 6,531,347 B1 | 3/2003 | Huster |
| 6,555,839 B2 | 4/2003 | Fitzgerald |
| 6,555,845 B2 | 4/2003 | Sunakawa et al. |
| 6,566,279 B2 | 5/2003 | Suemitsu et al. |
| 6,583,015 B2 | 6/2003 | Fitzgerald et al. |
| 6,583,048 B1 | 6/2003 | Vincent et al. |
| 6,593,191 B2 | 7/2003 | Fitzgerald |
| 6,593,211 B2 | 7/2003 | Sato |
| 6,613,695 B2 * | 9/2003 | Pomarede et al. ............ 438/767 |
| 6,657,223 B1 | 12/2003 | Wang et al. |
| 6,716,713 B2 | 4/2004 | Todd |
| 6,727,169 B1 | 4/2004 | Raaijmakers et al. |
| 6,743,721 B2 | 6/2004 | Lur et al. |
| 6,821,825 B2 | 11/2004 | Todd et al. |
| 6,881,633 B2 | 4/2005 | Hokazono |
| 6,900,115 B2 | 5/2005 | Todd |
| 6,958,253 B2 | 10/2005 | Todd |
| 6,962,859 B2 | 11/2005 | Todd et al. |
| 6,969,875 B2 | 11/2005 | Fitzgerald |
| 6,974,730 B2 | 12/2005 | Diaz |
| 6,998,305 B2 | 2/2006 | Arena et al. |
| 7,026,219 B2 | 4/2006 | Pomarede et al. |
| 7,078,765 B2 | 7/2006 | Kurotani et al. |
| 7,108,748 B2 | 9/2006 | Brabant et al. |
| 7,153,772 B2 | 12/2006 | Granneman et al. |
| 7,186,630 B2 | 3/2007 | Todd |
| 7,288,791 B2 | 10/2007 | Umeno et al. |
| 7,332,439 B2 | 2/2008 | Lindert |
| 7,335,959 B2 | 2/2008 | Curello et al. |
| 7,405,131 B2 | 7/2008 | Chong et al. |
| 7,438,760 B2 | 10/2008 | Bauer |
| 7,687,383 B2 | 3/2010 | Bauer |
| 7,754,013 B2 | 7/2010 | Granneman |
| 7,759,199 B2 | 7/2010 | Thomas et al. |
| 7,816,236 B2 | 10/2010 | Bauer |
| 2001/0001742 A1 | 5/2001 | Huang et al. |
| 2001/0034123 A1 | 10/2001 | Jeon et al. |
| 2001/0046766 A1 | 11/2001 | Asakawa |
| 2002/0022347 A1 | 2/2002 | Park et al. |
| 2002/0023520 A1 | 2/2002 | Hu |
| 2002/0034864 A1 | 3/2002 | Mizushima et al. |
| 2002/0052124 A1 | 5/2002 | Raaijmakers |
| 2002/0168868 A1 | 11/2002 | Todd |
| 2002/0173113 A1 | 11/2002 | Todd |
| 2003/0036268 A1 | 2/2003 | Brabant et al. |
| 2003/0047129 A1 | 3/2003 | Kawahara |
| 2003/0082300 A1 | 5/2003 | Todd et al. |
| 2003/0219981 A1 | 11/2003 | Ammon et al. |
| 2003/0230233 A1 | 12/2003 | Fitzgerald et al. |
| 2004/0171238 A1 | 9/2004 | Arena et al. |
| 2004/0185665 A1 | 9/2004 | Kishimoto et al. |
| 2004/0224089 A1 | 11/2004 | Singh et al. |
| 2004/0224504 A1 | 11/2004 | Gadgil |
| 2004/0262694 A1 | 12/2004 | Chidambaram |
| 2005/0023520 A1 | 2/2005 | Lee et al. |
| 2005/0042888 A1 | 2/2005 | Roeder et al. |
| 2005/0079691 A1 | 4/2005 | Kim et al. |
| 2005/0079692 A1 | 4/2005 | Samoilov et al. |
| 2005/0121719 A1 | 6/2005 | Mori |
| 2005/0176220 A1 | 8/2005 | Kanemoto |
| 2005/0250298 A1 | 11/2005 | Bauer |
| 2006/0011984 A1 | 1/2006 | Currie |
| 2006/0014366 A1 | 1/2006 | Currie |
| 2006/0057821 A1 | 3/2006 | Lee et al. |
| 2006/0115933 A1 | 6/2006 | Ye et al. |
| 2006/0115934 A1 | 6/2006 | Kim et al. |
| 2006/0148151 A1 | 7/2006 | Murthy et al. |
| 2006/0166414 A1* | 7/2006 | Carlson et al. ................. 438/149 |
| 2006/0169668 A1 | 8/2006 | Samoilov |
| 2006/0169669 A1 | 8/2006 | Zojaji et al. |
| 2006/0205194 A1 | 9/2006 | Bauer |
| 2006/0228842 A1 | 10/2006 | Zhang |
| 2006/0234504 A1 | 10/2006 | Bauer et al. |
| 2006/0240630 A1 | 10/2006 | Bauer et al. |
| 2006/0289900 A1 | 12/2006 | Thirupapuliyur et al. |
| 2007/0006800 A1 | 1/2007 | Lee et al. |
| 2007/0015374 A1 | 1/2007 | Granneman |
| 2007/0161316 A1 | 7/2007 | Taguchi et al. |
| 2007/0287272 A1 | 12/2007 | Bauer et al. |
| 2008/0026149 A1 | 1/2008 | Tomasini et al. |
| 2009/0075447 A1 | 3/2009 | Meunier-Beillard et al. |

FOREIGN PATENT DOCUMENTS

| | | |
|---|---|---|
| JP | 6010673 | 1/1994 |
| JP | 1997-251967 | 9/1997 |
| JP | 1999-514154 | 1/1998 |
| JP | 10256354 | 9/1998 |
| JP | 2000-208437 | 7/2000 |
| WO | WO 92/02879 | 2/1992 |
| WO | WO 96/17107 | 6/1996 |
| WO | WO 99/41423 | 8/1999 |
| WO | WO 99/62109 | 12/1999 |
| WO | WO 00/11721 | 3/2000 |
| WO | WO 00/13207 | 3/2000 |
| WO | WO 00/15866 | 3/2000 |
| WO | WO 00/15881 | 3/2000 |
| WO | WO 00/16377 | 3/2000 |
| WO | WO 00/22659 | 4/2000 |
| WO | WO 00/55895 | 9/2000 |
| WO | WO 00/75964 | 12/2000 |
| WO | WO 00/79576 | 12/2000 |
| WO | WO 01/15220 | 3/2001 |
| WO | WO 01/36702 | 5/2001 |
| WO | WO 01/45149 | 6/2001 |
| WO | WO 01/50502 | 7/2001 |
| WO | WO 01/66832 | 9/2001 |
| WO | WO 01/78123 | 10/2001 |
| WO | WO 01/78124 | 10/2001 |
| WO | WO 01/99166 | 12/2001 |

OTHER PUBLICATIONS

Bauer et al., "Tensile Strained Selective Silicon Carbon Alloys for Recessed Source Drain Areas of Devices," Meeting Abstract,, Electrochem. Soc., 2006, vol. 602, pp. 1414.

Goesele et al., "Diffusion Engineering by Carbon in Silicon", Mat. Res. Soc. Symp., 2000, vol. 610, pp. B71.1-B712.1.

Han et al, "Novel Enhanced Stressor with Graded Embedded SiGe Source/Drain for High Performance CMOS Devices", Electron Devices Meeting, IEDM '06 International, pp. 1-4 (San Francisco, Dec. 2006).

Ito et al, "Mechanical Stress Effect of Etch-Stop Nitride and its Impact on Deep Submicron Transistor Design", Electron Devices Meeting, IEDM Technical Digest International, pp. 247-250 (San Francisco, Dec. 2000).

Jeong S. Byun, Kwan G. Rha et al., "Epitaxial TiSi2 Growth on Si(100) From Reactive Sputtered TiNx and Subsequent Annealing", Materials Research Soc. Proceedings, vol. 355, Pittsburgh, 1995, pp. 465-470.

Jeong Soo Byun, "Epitaxial C49-TiSi2 Formation on (100)Si Substrate Using TiNx and Its Electrical Characteristics as a Shallow Contact Metallization", J. Electrochem. Soc., vol. 143, No. 6, Jun. 1996, pp. 1984-1991.

Jeong Soo Byun, Chang Reol Kim et al., "TiN/TiSi2 Formation Using TiNx Layer and Its Feasibilies in ULSI", Jpn. J. Appl. Phys. vol. 35 (1995), pp. 982-986.

Jeong Soo Byun, Hak Nam Kim et al., "Formation of a large grain sized TiN layer using TiNx, the epitaxial continuity at the Al/TiN interface . . .", J. Appl. Phys. 78(3), Aug. 1, 1995, pp. 1719-1724.

Jeong Soo Byun, Jun Ki Kim et al., "W as a Bit Line Interconnection in Capacitor-Over-Bit-Line (COB) Structured Dynamic Random Access Memory (DRAM) and Feasible Diffusion Barrier Layer", Jpn. J. Appl. Phys. vol. 35 (1996), pp. 1086-1089.

Kavalieros et al., "Tri-Gate Transistor Architecture with High-k Gate Dielectrics, Metal Gates and Strain Engineering", Components Research, Technology and Manufacturing Group, Intel Corporation, Hillsboro, Oregon.

Kelires, "Monte Carlo studies of ternary semiconductor alloys: application to the Si1-x-yGexCy system", Physical Review B, Aug. 7, 1995, vol. 75, pp. 1114-1117.

Kelires, "Short-range order, bulk moduli, and physical trends in c-Si1-xCx alloys", Physical Review B, Apr. 1, 1997, vol. 55, pp. 8784-8787.

Kuznetsov et al., "Continuity in development of ultra shallow junctions for 130-45 nm CMOS: the tool and annealing methods," Abstract 11th IEEE, RTP 2003 Conference, Sep. 23-26, 2003, Charleston, USA.

Lauwers, et al., "Low temperature spike anneal for Ni-silicide formation," Microelectronic Engineering 76, 303-310 (MAM2004, Brussels, Belgium, Mar. 7-10, 2004).

Nakahata et al, "Low thermal budget surface cleaning after dry etching for selective silicon epitaxial growth", *Journal of Crystal Growth*, 226, pp. 443-450 (2001).

Washington et al, "pMOSFET with 200% Mobility Enhancement Induced by Multiple Stressors", IEEE Electron Device Letters, vol. 27, No. 6, pp. 511-513 (Jun. 2006).

Wolansky et al, "Low temperature clean for Si/SiGe epitaxy for CMOS integration of heterojunction bipolar transistors", *Proceedings of the 8th International Symposium on Silicon Materials Science and Technology 1*, pp. 812-821 (1998).

Wolf et al., "Silicon epitaxial growth and silicon on insulator", Chapter 7 in Silicon Processinig for the VLSI Era, vol. 1: process technology, 2nd Ed., 2000, pp. 225-264.

Wolf et al., "Silicon Processing for the VLSI era vol. 1: Process technology", Lattice Press, 1986, pp. 140-142 and 155-156, Sunset Beach, CA.

Wu et al., "Stability and mechanism of selective etching of ultrathin Ge films on the Si(100) surface upon chlorine adsorption", Physical Review B, 2004, vol. 69, pp. 045308.

Wu et al., "Thermal reactions on the Cl-termination SiGe(100) surface", Surface Science, 2002, vol. 507-510, pp. 295-299.

Yamamoto et al., "Chemical vapor phase etching of polycrystalline selective to epitaxial Si and SiGe", Thin Solid Films, 2006, vol. 508, pp. 297-300.

Yang et al, "Dual Stress Liner for High Performance sub-45nm Gate Length SOI CMOS Manufacturing", Electron Devices Meeting, IEDM Technical Digest International, pp. 1075-1077 (Dec. 2004).

Zhu, "Modeling of germanium and antimony diffusion in Sit-xGex", Electrochemical Society Proceedings, 2004, vol. 2004-07, pp. 923-934.

Abeles et al., Amorphous Semiconductor Superlattices; Physical Review Letters; Nov. 21, 1983; pp. 2003-2006; vol. 51; No. 21.

Antonell et al., "Carbon incorporation for strain compensation during solid phase epitaxial recrystallization of SiGe on Si at 500-600α C.", J. Appl. Phys. 79 (10), pp. 7646-7651 (1996).

Aoyama, T., "Si Selective Epitaxial Growth Using CI2 Pulsed Molecular Flow Method," Thin Solid Films 321 (1998) 256-260, © 1998 Elsevier Science S.A.

Bauer et al., "Si3H8 based epitaxy of biaxially stressed silicon films doped with carbon and arsenic for CMOS applications", in Semiconductor Defect Engineering—Materials, Synthetic Structures and Devices, edited by S. Ashok, J. Chevallier, B.L. Sopori, M. Tabe, and P. Kiesel (Mater. Res. Soc. Symp. Proc. 864, Warrendale, PA, 2005), E4.30.

Bauer et al., "Time resolved reflectivity measurements of silicon solid phase epitaxial regrowth", Thin Solid Films 364, pp. 228-232 (2000).

Bedair, Selective area and sidewall growth by atomic layer epitaxy; Semicond Sci. Technol; 1993; 1052-1062; vol. 8.

Berti et al., Lattice Parameter in Si1-yCy epilayers: Deviation from Vegards Rule, Applied Physics Letters, Mar. 30, 1998, vol. 72, Issue 13, pp. 1602-1604.

Bogumliowicz et al., Chemical Vapour Etching of Si SiGe and Ge with HCl Applications to the Formation of Thin Relaxed SiGe Buffers and to the Revelation of Threading Dislocations, Semicond. Sci. Technol., 2005, vol. 20, pp. 127-134.

Byun et al., Epixaxial TiSi2 Growth on Si(100)From Reactive Sputtered TiNx and Subsequent Annealing, Materials Research Soc. Proceedings, vol. 355, pp. 465-470, Pittsburgh, 1995.

Byun et al., Epitaxial C49-TiSi2 Formation on (100) Si Substrate Using TiNx and its Electrical Characteristics as a Shallow Contact Metallization, J. Electrochem. Soc., vol. 143, Issue 6, Jun. 1996, pp. 1984-1991.

Byun et al., Tin/TiSi2 Formation Using TiNx Layer and it's Feasibilities in ULSI, Jpn. J. Appl. Phys., vol. 35 (1995), pp. 982-986.

Byun et al., Formation of a Large Grain Sized TiN Layer Using TiNx, the Epitaxial Continuity at the Al/Tin Interface, and its Electromigration Endurance in Multilayer Interconnection, J. Appl. Phys., Aug. 1995, vol. 78(3), pp. 1719-1724.

Byun et al., W as a Bit Line Interconnection in Capacitor-Over-Bit-Line (COB) Structured Dynamic Random Access Memory (DRAM) and Feasible Diffusion Barrier Layer, Jpn. J. Appl. Phys., 1996, vol. 35, pp. 1086-1089.

Celotti et al., Lattice Parameter Study of Silicon Uniformly Doped with Boron and Phosphorus, Journal of Materials Science, May 1974, vol. 9, Issue 5, pp. 821-828.

Chowhurdy et al., In-Situ Real-Time Mass Spectroscopic Sensing and Mass Balance Modeling of Selective Area Silicon PECVD, AIP Conference Proceedings, American Institute of Physics, Mar. 23, 1998, vol. 449, pp. 363-367.

Develyn et al., Adsorpsion, Desorption and Decomposition of HCl and HBr on Ge(100)-Competitive Pairing and Near-First Order Desorption-Kinetics, Journal of Chemical Physics, 1994, vol. 101, Issue 3, pp. 2463-2475.

Düscö et al., Deposition of Tin Oxide into Porous Silicon by Atomic Layer Epitaxy; J. Electrochem. Soc.; Feb. 1996; pp. 683-687; vol. 143, No. 2.

Eberl et al., "Structural properties of SiC and SiGeC alloy layers on Si", Chapter 2.5 in "Properties of Silicon Germanium and SiGe:Carbon", Institution of Electrical Engineers, pp. 75-77 (1999).

Fazan et al., A High-C Capacitor (20.4 Ff/µm2) with Ultrathin CVD—Ta2O5 Films Deposited on Rugged Poly-Si for High Density DRAMs; IEEE; 1992; pp. IEDM 92-263-IEDM 92-266.

Feng et al., "Raman determination of layer stresses and strains for heterostructures and its application to the cubic SiC/Si system", J. Appl. Phys. 64 (12), pp. 6827-6835 (1988).

George et al., Nucleation and Growth During Tungsten Atomic Layer Deposition on Oxide Surfaces; Mat. Res. Symp. Proc. vol. 672; Materials Research Society 2001; 07.7.1-07.7.7.

Hartmann et al., High C Content Si/Si yCy Heterostructures for n-type Metal Oxide Semiconductor Transistors, Semicon. Sci. Technol., 2004, vol. 19, pp. 593-601.

Haukka et al., Chemisorption of chromium acetylacetonate on porous high surface area silica; Applied Surface Science 75; 1994; pp. 220-227.

Hiltunen et al., Nitrides of Titanium, Niobium, Tantalum and Molybdenum Grown as Thin Films by the Atomic Layer Epitaxy Method; Thin Solid Films; 1988; pp. 149-154; vol. 166.

Horiike et al., Filling of Si Oxide into a Deep Trench using Digital CVD Method; Applied Surface Science; 1990; pp. 168-174; vol. 46.

Hoyt, "Substitutional carbon incorporation and electronic characterization of Si1-yCy/Si and Si1-x-yGexCy/Si heterojunctions", Chapter 3 in "Silicon-Germanium Carbon Alloy", Taylor and Francis (New York, NY), pp. 59-89 (2002).

International Search Report and Written Opinion of the International Searching Authority for International Application No. PCT/US2007/011464.

Iyer et al., Synthesis of Si1-yCy Alloys by Molecular Beam Epitaxy, Applied Physics Letters, Jan. 20, 1992, vol. 60, Issue 3, pp. 356-358.

Jin et al., Porous Silica Xerogei Processing and Integration for ULSI Applications; Materials Research Society Symposium Proceedings; 1998; pp. 213-222; vol. 511.

Jorke, "Segregation of Ge and dopant atoms during growth of SiGe layers", Chapter 6.3 in "Properties of Silicon Germanium and SiGe:Carbon", Institution of Electrical Engineers, pp. 287-301 (1999).

Juppo et al., Deposition of copper films by an alternate supply of CuCl and Zn; J. Vac. Sci. Technol.; 1997; pp. 2330-2333; Issue A 15(4).

Kaizuka et al., Conformal Chemical Vapor Deposition TiN(111) Film Formation as an Underlayer of Al for Highly Reliable Interconnects; Jpn. J. Appl. Phys.; 1994; pp. 470-474; vol. 33.

Kelires, Monte Carlo Studies of Ternary Semiconductor Alloys: Application to teh Si1-x-yGexCy System, Physical Review Letters B, Aug. 7, 1995, vol. 75, Issue 6, pp. 1114-1117.

Kikkawa et al., A Quarter-Micrometer Interconnection Technology Using a TiN/Al-Si-Cu/TiN/Al-Si-Cu/TiN/Ti Multilayer Structure; IEEE Transactions on Electron Devices; Feb. 1993; pp. 296-302; vol. 40, No. 2.

Kikkawa et al., Al-Si-Cu/TiN multilayer interconnection and Al-Ge reflow sputtering technologies for quarter-micron devices; SPIE; 1992; pp. 54-64; vol. 1805.

Kim et al., Low Temperature Selective Si Epitaxy by Reduced Pressure Chemical Vapor Deposition Introducing Periodic Deposition and Etching Cycles with SiH4, H2 and HCl., Mat. Res. Soc. Symp. Proc, 2000, vol. 609, pp. A8.2.1 to A8.2.6.

Kim et al., Applicability of ALE TiN films as Cu/Si diffusion barriers; Thin Solid Films; 2000; pp. 276-283; 372(1).

Kim et al., Comparison of TiN and TiAlN as a Diffusion Barrier Deposited by Atomic Layer Deposition; Journal of the Korean Physical Society; 2002; pp. 176-179; 40(1).

Klaus et al., Atomic Layer Deposition of SiO2 Using Catalyzed and Uncatalyzed Self-Limiting Surface Reactions; Surface Review and Letters; 1999; pp. 435-448; vol. 6, Nos. 3 & 4.

Klaus et al., Atomic Layer Deposition of Tungsten Nitride Films Using Sequential Surface Reactions; J. Electrochem Soc.; 2000; 1175-1181; 147(3).

Klaus et al., Atomically controlled growth of tungsten and tungsten nitride using sequential surface reactions; Applied Surface Science; 2000; pp. 479-491; vols. 162-163.

Koo et al., Study on the characteristics of Ti AlN thin film deposited by atomic layer deposition method; Journal of Vacuum Science & Technology, A: Vacuum Surfaces, and Films; 2001; 2931-2834; 19(6).

Kouvetakis et al., "Synthesis and analysis of compounds and alloys in the GeC, SiC, and SiGeC systems", Chapter 2 in Series—Optoelectronic properties of semiconductors and superlattices; v. 15 Silicon-germanium carbon alloy / edited by S.T. Pantelides and S. Zollner; pp. 19-58.

Kukli et al., Atomic Layer Epitaxy Growth of Tantalum Oxide Thin Films from Ta(OC2H5)5 and H2O; J. Electrochem. Soc.; May 1995; pp. 1670-1674; vol. 142, No. 5.

Leskelä et al., Atomic Layer Epitaxy in Deposition of Various Oxide and Nitride Thin Films; Journal De Physique IV, Colloque C5, supplement au Journal de Physique II; Jun. 1995; pp. C5-937-05-951; vol. 5.

Lin et al., Chlorine-Induced Si Surface Segregation on the Ge-Terminated Si/Ge(100) Surface from Core Level Photoemission, Physical Review B, 2001, vol. 64, Issue 233302.

Lin et al., Atomistics of Ge Deposition on Si(100) by Atomic Layer Epitaxy, Physical Review Letters, Jan. 31, 2003, vol. 90(4), Issue 046102.

Lou et al, The Process Window of a-Si/Ti Bilayer Metallization for an Oxidation-Resistant and Self-Aligned TiSi2 Process, IEE Transactions of Electron Devices, Aug. 1992, vol. 39, Issue 8, pp. 1835-1843.

MacKnight et al., "RTP applications and technology options for the sub-45 nm node", Proceedings, RTP2004 Conference (Portland, OR) (2004).

Martensson et al., Atomic layer epitaxy of copper an ab initio investigation of the CuCl/H2 process III. Reaction barriers; Appl. Surf. Sci.; 2000; 92-100; 157(1).

Martensson et al., Atomic Layer Epitaxy of Copper on Tantalum; Chemical Vapor Deposition; 1997; pp. 45-50; vol. 3, No. 1.

Martensson et al.; Atomic Layer Epitaxy of Copper, Growth and Selectivity in the Cu(II)-2,2,6, 6-tetramethyl-3,5-heptanedionate/H2 Process; J. Electrochem. Soc.; Aug. 1998; pp. 2926-2931; vol. 145, No. 8.

Martensson et al., CU(THD)2 as Copper Source in Atomic Layer Epitaxy; Electrochem. Soc. Proc.; 1997; 1529-1536; 97-25.

Martensson et al., Use of Atomic Layer Epitaxy for Fabrication of Si/TiN/Cu Structures; J. Vac. Sci. Technol. B, Sep./Oct. 1999; pp. 2122-2128; vol. 17, No. 5.

McVay et al., The Diffusion of Germanium in Silicon, Journal of Applied Physics, Mar. 1973, vol. 44, Issue 3, pp. 1409-1410.

McVay et al., Diffusion of GE in SiGe Alloys, Physical Review B, Jan. 1974, pp. 627-631.

Meléndez-Lira et al., "Substitutional carbon in Si1-yCy alloys as measured with infrared absorption and Raman spectroscopy", J. Appl. Phys. 82, No. 9 pp. 4246-4252 (1997).

Min et al., Atomic Layer Deposition of TiN Films by Alternate Supply of Tetrakis (ethylmethylamino)-Titanium and Ammonia; Japanese Journal of Applied Physics; 1998; pp. 4999-5004; vol. 37.

Min et al., Chemical Vapor Deposition of Ti-Si-N Films with Alternating Source Supply; Mat. Res. Soc. Symp. Proc.; 1999; pp. 207-210; vol. 564; Materials Research Society.

Min et al., Metal-Organic Atomic-Layer Deposition of Titanium-Silicon-Nitride Films; Applied Physics Letters; 1999; pp. 1521-1523; vol. 75, No. 11.

Min, Atomic Layer Deposition of TiN Thin Films by Sequential Introduction of Ti Precursor and NH3; Materials Research Society Symposium Proceedings; 1998; pp. 337-343; vol. 514.

Mitchell et al., Germanium Diffusion in Polysilicon Emitters of SiGe Heterojunction Bipolar Transistors Fabricated by Germanium Implantation, Journal of Applied Physics, Dec. 1, 2002, vol. 92, Issue 11, pp. 6924-6926.

Moller, Copper and Nickel Ultrathin Films on Metal-Oxide Crystal Surfaces Mater. Soc. Monogr.; 1994; 473-526; 81.

Nakahata et al., Formation of selective Epitaxially Grown Silicon with a flat Edge by Ultra-High Volume Vacuum Chemical Vapor Deposition, Journal of Crystal Growth, 2001, vol. 233, pp. 82-87.

Nakahata et al., Optimization of Process Conditions of Selective Epitaxial Growth for Elevated Source/Drain CMOS Transistor, Journal of Crystal Growth, 2002, vol. 243, pp. 87-93.

Nakahata et al., Low Thermal Budget Selective Epitaxial Growth for Formation of Elevated Source/Drain MOS Transistors, Journal of Crystal Growth, 2004, vol. 264, pp. 79-85.

Niinistö et al., Synthesis of oxide thin films and overlayers by atomic layer epitaxy for advanced applications; Materials Science and Engineering; 1996; pp. 23-29; vol. B41.

O'Neil et al., "Optimization of process conditions for selective silicon epitaxy using disilane, hydrogen, and chlorine", J. Electrochem. Soc. 144 (9), pp. 3309-3315 (1997).

Oehme et al., "A novel measurement method of segregating adlayers in MBE", Thin Solid Films 369, pp. 138-142 (2000).

Oehme et al., "Carbon segregation in silicon", Thin Solid Films 380, pp. 75-77 (2000).

Osten et al., "Substitutional carbon incorporation in epitaxial Si1-yCy alloys on Si(001) grown by molecular beam epitaxy", Applied Physics Letters 74 (6), pp. 836-838 (1999).

Osten et al., "Substitutional versus interstitial carbon incorporation during psuedomorphic growth of Si1-yCy on Si(001)", J. Appl. Phys. 80 (12), pp. 6711-6715 (1996).

Ott et al., Modification of Porous Alumina membranes Using Al2O3 Atomic Layer Controlled Deposition; Chem. Mater.; 1997; pp. 707-714; vol. 9.

Pages et al., The Effect of Ramp Rate—Short Process Time and Partial Reactions on Colbalt and Nickel Silicide Formation, Proceedings 205th ECS Meeting, May 9-13, 2004, pp. 174-182, San Antonio, TX.

PCT Search Report, PCT Application PCT/US2006/003333; Jun. 30, 2006.

PCT Search Report, PCT Application PCT/US2006/003465; Jul. 7, 2006.

Ritala et al., Atomic Layer Epitaxy Growth of TiN Thin Films from TiI4 and NH3; J. Electrochem. Soc.; Aug. 1998; pp. 2914-2920; vol. 145; No. 8.

Ritala et al., Controlled Growth of TaN, Ta3N5, and TaOxNy Thin Films by Atomic Layer Deposition; Chem. Mater.; 1999; pp. 1712-1718; vol. 11.

Ritala et al., Effects of intermediate zinc pulses on properties of TiN and NbN films deposited by atomic layer epitaxy; Appl. Surf. Sci.; 1997; 199-212; 120.

Ritala et al., Perfectly Conformal TiN and Al2O3 Films Deposited by Atomic Layer Deposition; Chem Vap. Deposition; 1999; pp. 7-9; vol. 5, No. 1.

Rossnagel et al., Plasma-enhanced atomic layer deposition of Ta and Ti for interconnect diffusion barriers; J. Vac. Sci. Technol. ; 2000; 2016-2020; 18(4).

Ryan et al., Material Property Characterization and Integration Issues for Mesoporous Silica; IEEE, 1999, pp. IITC 99-187-IITC 99-189.

Sakaue et al., Digital Chemical Vapor Deposition of SiO2 Using a Repetitive Reaction of Triethylsilane/Hydrogen and Oxidation; Japanese Journal of Applied Physics; Jan. 1990; pp. L124-L127; vol. 30, No. 1B.

Sakurai et al., Adsorption, Diffusion and Desorption of Cl atoms on Si(111) Surfaces, Journal of Crystal Growth, 2002, vol. 237-239.

Singer; Atomic Layer Deposition Targets Thin Films; Semiconductor International; Sep. 1999; pp. 40.

Smith et al., Plasma Enhanced Selective Area Micocrystalline Silicon Deposition on Hydrogenated Amorphous Silicon: Surface Modification for Controlled Nucleation, Journal of Vacuum Science and Technology, American Institute of Physics, May 1998, vol. 16, Issue 3, pp. 1316-1320.

Sneh et al., Atomic layer growth of SiO2 on Si(100) using SiCl4 and H2O in a binary reaction sequence; Surface Science; 1995; pp. 135-152; vol. 334.

Solanki et al., Atomic Layer Deposition of Copper Seed Layers; Electrochem. and Solid State Lett.; 2000; 479-480; 3(10).

Soman et al., Selective Area Chemical Vapor Deposition of Si-xGex Thin Film Alloys by the Alternating Cyclic Method: Experimental Data: II Morphology and Compsition as a Function of Deposition Parameters, Journal of the Electrochemical Society, May 2000, vol. 147, Issue 5, pp. 1854-1858.

Soman et al., Selective Area Chemical Vapor Deposition of Si1-xGex Thin Film alloys by the Alternating Cyclic Method: A Thermodynamic Analyisis: II. The System Si-Ge-Cl-H-Ar, Journal of the Electrochemical Society, Nov. 2000, vol. 147, Issue 11, pp. 4342-4344.

Strane et al., "Carbon incorporation into Si at high concentrations by ion implantation and solid phase epitaxy", J. Appl. Phys. 79 (2), pp. 637-646 (1996).

Strane et al., "Precipitation and relaxation in strained Si1-yCy/Si heterostructures", J. Appl. Phys. 76 (6), pp. 3656-3668 (1994).

Tiitta et al., Preparation and Characterization of Phosphorus-Doped Aluminum Oxide Thin Films; Materials Research Bulletin; 1998; pp. 1315-1323; vol. 33, No. 9.

U.S. Department of Commerce National Technical Information Service; Ceramic Coatings on Metals Using Atomic Layer Controlled Chemical Vapor Deposition (Assert-96); Feb. 16, 2000; University of Colorado at Boulder.

Utriainen et al.; Studies of metallic thin film growth in an atomic layer epitaxy reactor using M(ACAC)2 (M=Ni,Cu,Pt) precursors; Appl. Surf. Sci.; 2000; 151-158; 157(3).

Van Houtum et al., TiSi2 Strap Formation by Ti-amorphous-Si Reaction, J. Vac. Sci. Technol. B, Nov./Dec. 1988, vol. 6(6).

Van Zant, "Microchip Fabrication", 4th Ed., McGraw Hill (New York, NY), pp. 364-365 (2000).

Violette et al., "On the role of chlorine in selective silicon epitaxy by chemical vapor deposition", J. Electrochem. Soc. 143 (10), pp. 3290-3296 (1996).

Wang, Spin on Dielectric Films—A General Overview; 1998 5th International Conference on Solid-State and Integrated Circuit Technology Proceedings; Oct. 21-23, 1998; p. 961; Beijing, China.

Windl et al., "Theory of strain and electronic structure of Si1-yCy and Si1-x-yGexCy alloys", Phys. Rev. B 57 (4), pp. 2431-2442 (1998).

Wise et al., Diethyldiethoxysilane as a New Precursor for SiO2 Growth on Silicon; Mat. Res. Soc. Symp. Proc.; 1994; pp. 37-43; vol. 334.

Wolf et al., Process and Equipment Simulation of Copper Chemical Vapor Deposition Using Cu(hfac)vtms; Microelectronic Engineering; 1999; 15-27; 45.

Yagi et al., Substitutional C incorporation into Si1-yCy alloys using novel carbon source, 1,3-disilabutane; Japanese Journal of Applied Physics; 2004; pp. 4153-4154; vol. 43, No. 7A.

Zhang et al., "Selective epitaxial growth using dichlorosilane and silane by low pressure chemical vapor deposition," Microelectric Engineering 73-74, pp. 514-518 (2004).

* cited by examiner

US 8,367,528 B2

CYCLICAL EPITAXIAL DEPOSITION AND ETCH

BACKGROUND OF THE INVENTION

1. Field of the Invention

The present application relates to methods of epitaxial deposition of silicon-containing materials. More specifically, the present application relates to methods of cyclical epitaxial deposition and etch.

2. Description of the Related Art

Semiconductor processing is typically used in the fabrication of integrated circuits, which entails particularly stringent quality demands. A variety of methods are used in the semiconductor manufacturing industry to deposit material onto surfaces. One of the most widely used methods is chemical vapor deposition ("CVD"), in which atoms or molecules contained in a vapor deposit on a surface to form a film. CVD allows for the growth of films on device surface areas, including "epitaxial" films comprised of a crystalline silicon-containing material.

In some applications it may be desirable to achieve uniform or "blanket" deposition of epitaxial growth over mixed surfaces, such as insulating and semiconductor surfaces, while in other applications it is desirable to achieve "selective" deposition only over selected surfaces. Such selective deposition allows for growth in particular regions of an underlying structure by taking advantage of differential nucleation during deposition on different materials.

Selective deposition generally involves simultaneous deposition and etching of an epitaxial material. During a typical selective deposition process, a precursor of choice may be introduced that has a tendency to nucleate and grow more rapidly on one surface (e.g., a semiconductor surface) and less rapidly on another surface (e.g., an oxide surface). An etchant is added to the deposition process which has a greater effect upon the poorly nucleating film as compared to the rapidly nucleating film, therefore allowing growth on only specified surface areas. The relative selectivity of a selective deposition process is tunable by adjusting factors that affect the deposition rate (for example, precursor flow rate, temperature and pressure) and the rate of etching (for example, etchant flow rate, temperature and pressure). By precise tuning, epitaxial growth may be achieved with complete (e.g., zero growth on insulators and net growth, albeit slow, on single crystal windows) or partial (e.g., net growth on insulators and single crystal windows, with the net growth on the insulator being of lesser thickness than on the single crystal windows) selectivity on desired surfaces. However, while known processes often result in selective epitaxial growth, such growth is often of poor quality. For example, in current processes that provide selective growth in source/drain recesses, pronounced crystallographic defects may often originate in the bottom corner and sidewalls of the recess areas, resulting in undesirable, low quality epitaxial growth.

In addition to growing epitaxial material that is of high quality, it is often desirable to have epitaxial material that is strained. "Strain" may influence the electrical properties of semiconductors materials, such as silicon, carbon-doped silicon, germanium and silicon germanium alloys. Tensile strain helps to enhance electron mobility, which is particularly desirable for NMOS devices, while compressive strain helps to enhance hole mobility, which is particularly desirable for PMOS devices. Methods of providing strained material are thus of considerable interest and have potential applications in a variety of semiconductor processing applications.

It is therefore of considerable interest to provide methods of depositing epitaxial layers selectively that are of high quality and which may be strained to enhance electrical properties of semiconductor devices. It is also of considerable interest that these methods of deposition be performed efficiently to provide the added benefit of high throughput.

SUMMARY OF THE INVENTION

The present application describes methods of cyclical epitaxial deposition and etch. Some embodiments can provide for bottom-up growth of epitaxial material that is of high quality.

In one embodiment, a method for selectively forming silicon-containing material in a recess is provided. A substrate including a recess is introduced, whereby a pulse of silicon-containing source vapor is used to deposit silicon-containing material in the recess. A continuous etchant flow of one or more vapor-phase etchants is provided to remove portions of the deposited silicon-containing material from the recess. Additional pulses of silicon-containing sources may be introduced repeatedly to deposit silicon-containing material in the recess.

In one embodiment, a method for selectively depositing silicon-containing source material in a processing chamber is provided. A transistor structure having an insulated gate and exposed semiconductor material is introduced into the processing chamber. A flow of one or more etchants may be introduced into the processing chamber. A silicon-containing source flow may be introduced into the processing chamber to selectively deposit epitaxial material on the semiconductor material while maintaining etchant flow, and subsequently be stopped. Additional pulses of silicon-containing sources may be introduced repeatedly to form successive layers of deposited epitaxial material.

DETAILED DESCRIPTION OF THE EMBODIMENTS

Figure 1:
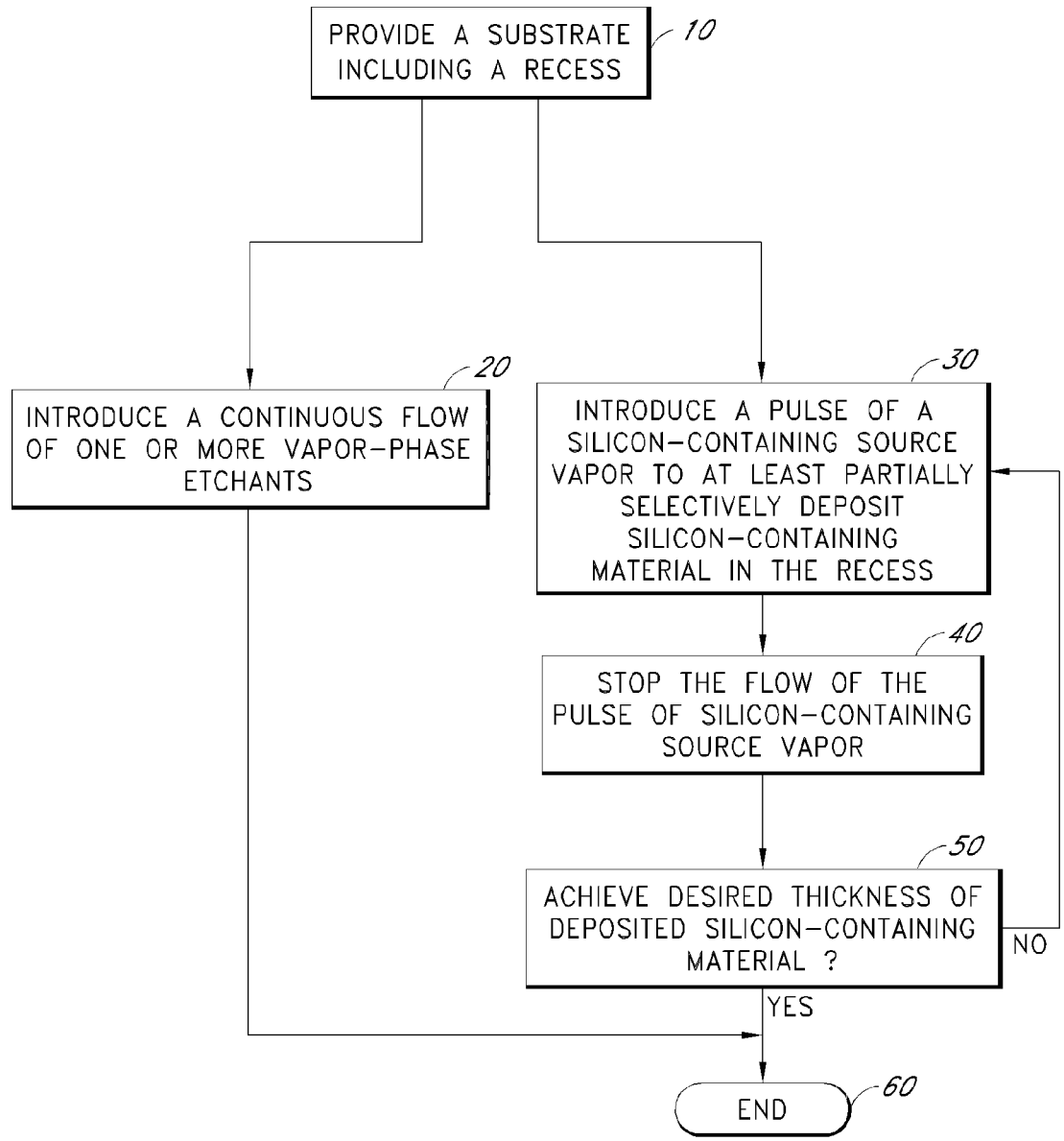
FIG. 1 shows a flow chart illustrating a selective formation process according to one embodiment of the present application.

Improved methods of selective epitaxial formation are described herein. These methods provide for the selective formation of high quality epitaxial material. According to some embodiments, two or more pulses of silicon-containing vapor can be introduced during a continuous etchant flow, preferably under isothermal and isobaric conditions, to provide high quality epitaxial growth in a bottom-up fashion on desired surface areas.

The term "silicon-containing material" and similar terms are used herein to refer to a broad variety of silicon-containing materials, including without limitation, silicon (including crystalline silicon), carbon-doped silicon ("Si:C"), silicon germanium ("SiGe"), SiGeSn, and carbon-doped silicon germanium ("SiGe:C"). As used herein, "carbon-doped silicon", "Si:C", "silicon germanium", "SiGe," "carbon-doped silicon germanium", "SiGe:C" and similar terms refer to materials that contain the indicated chemical elements in various proportions and, optionally, minor amounts of other elements. For example, "silicon germanium" is a material that comprises silicon, germanium and, optionally, other elements, for example, dopants such as carbon and electrically active dopants. Shorthand terms such as "Si:C" and "SiGe:C" are not stoichiometric chemical formulas per se and thus are not limited to materials that contain particular ratios of the indicated elements. Methods taught herein for selective formation of epitaxial materials have particular advantages for bottom-up filling of recesses with epitaxial carbon-doped semiconductor for tensile strain, but the skilled artisan will find application for the methods taught herein for a wide variety of semiconductor materials. In addition, the methods taught herein are also applicable to depositing silicon-material on finFET devices, tri-gates, OMEGA FETs, and other devices.

Substrate can refer either to the workpiece upon which deposition is desired, or the surface exposed to one or more deposition gases. For example, in certain embodiments, the substrate is a single crystal silicon wafer, a semiconductor-on-insulator ("SOI") substrate, or an epitaxial silicon surface, a silicon germanium surface, or a III-V material deposited upon a wafer. Workpieces are not limited to wafers, but also include glass, plastic, or other substrates employed in semiconductor processing. In some embodiments, the substrate has been patterned to have two or more different types of surfaces, such as both semiconductor and insulator surfaces. Examples of insulator materials include silicon dioxide, including low dielectric constant forms, such as carbon-doped and fluorine-doped oxides of silicon, silicon nitride, metal oxide and metal silicate. In certain embodiments, silicon-containing layers are selectively formed over single crystal semiconductor materials while allowing for minimal or zero growth of material over adjacent insulators. According to some embodiments, any material growth over adjacent insulators may be amorphous or polycrystalline non-epitaxial growth.

In certain applications, a patterned substrate has a first surface having a first surface morphology and a second surface having a second surface morphology. Even if surfaces are made from the same elements, the surfaces are considered different if the morphologies or crystallinity of the surfaces are different. Amorphous and crystalline are examples of different morphologies. Polycrystalline morphology is a crystalline structure that consists of a disorderly arrangement of orderly crystals and thus has an intermediate degree of order. The atoms in a polycrystalline material are ordered within each of the crystals, but the crystals themselves lack long range order with respect to one another. Single crystal morphology is a crystalline structure that has a high degree of long range order. Epitaxial films are characterized by an in-plane crystal structure and orientation that is identical to the substrate upon which they are grown, typically single crystal. The atoms in these materials are arranged in a lattice-like structure that persists over relatively long distances on an atomic scale. Amorphous morphology is a non-crystalline structure having a low degree of order because the atoms lack a definite periodic arrangement. Other morphologies include microcrystalline and mixtures of amorphous and crystalline material. "Non-epitaxial" thus encompasses amorphous, polycrystalline, microcrystalline and mixtures of the same. As used herein, "single-crystal" or "epitaxial" are used to describe a predominantly large crystal structure having a tolerable number of faults therein, as is commonly employed for transistor fabrication. The crystallinity of a layer generally falls along a continuum from amorphous to polycrystalline to single-crystal; a crystal structure is often considered single-crystal or epitaxial despite a low density of faults. Specific examples of patterned substrates having two or more different types of surfaces, whether due to different morphologies and/or different materials, include without limitation: single crystal/polycrystalline, single crystal/amorphous, single crystal/dielectric, conductor/dielectric, and semiconductor/dielectric. Methods described herein for depositing silicon-containing films onto patterned substrates having two types of surfaces are also applicable to mixed substrates having three or more different types of surfaces.

FIG. 1 shows a flow chart illustrating a selective formation process according to one embodiment of the present application. The flow chart illustrates the steps of providing 10 a substrate including a recess; introducing 20 a continuous flow of one or more vapor-phase etchants; introducing 30 a pulse of a silicon-containing source vapor to at least partially selectively deposit silicon-containing material in the recess during the continuous etchant flow; stopping 40 the flow of the pulse of silicon-containing source vapor while maintaining the continuous etchant flow; and at decision box 50, repeating introducing 30 and stopping 40 a pulse of a silicon-containing source vapor throughout the continuous etchant flow until a desired thickness of deposited silicon-containing material is achieved and the process ends 60.

In accordance with FIG. 1, a substrate to be processed may be provided 10 into a reaction chamber. In some embodiments, the substrate may be patterned to have two or more types of surfaces, such as semiconductor and insulator surfaces. Examples of insulator materials include silicon oxides, silicon nitride, metal oxides, metal silicates and low dielectric constant materials such as siloxane polymers, carbon-doped and fluorine-doped silicon oxides. Typically silicon containing deposition 30 nucleates on such insulators at a slower rate and/or produces a silicon-containing layer morphology that is more susceptible to etching than epitaxial material.

In the illustrated embodiment, the substrate to be processed includes a recess. In other embodiments, the substrate to be processed may include no recess and selective deposition will occur on a different surface, such as on the top surface of a substrate (Si<100>) or on the sidewalls of fins (e.g., for a finFET). In some embodiments, the substrate will include more than one recess, such as two or more recesses that form active source and drain regions of a transistor device. These recesses are generally adjacent to a channel region that may benefit from the deposition of strained material into the recesses.

In accordance with FIG. 1, a continuous flow of one or more vapor-phase etchants is introduced 20 into the processing chamber. The term "continuous" as used herein refers to a continued flow of one or more etchants during the entire selective deposition process while other reactants are started and stopped cyclically several times. Such a continuous flow may include one or more etchants that flow throughout the selective deposition process. In some embodiments, one or more etchants may be introduced intermittently throughout the process, while at least one other etchant is flowing at all times throughout the selective deposition process. For example, according to one embodiment, a continuous etchant flow may include introducing $Cl_2$ as an etchant throughout the selective deposition process, while introducing HCl and/or germane as a second etching agent periodically during the $Cl_2$ flow. Providing an etchant during a periodic deposition process, while continuously flowing etchant between deposition phases can provide a number of benefits. For example, growth rates during the deposition can be tuned for various purposes (step coverage, dopant incorporation, throughput speed, etc.) independently of the need for selectivity, since the intervening etch phases can accomplish the selectivity. Moreover, epitaxial growth during the deposition phase can be of higher quality than epitaxial growth formed without using an etchant.

In one embodiment, a single vapor-phase etchant is introduced, while in other embodiments, two, three, or more vapor-phase etchants may be used throughout the selective deposition process. These etchants may include halide gases, such as $Cl_2$ and HCl. Other examples include $Br_2$, HBr, and HI One or more of these etchants will be introduced into a processing chamber having a temperature between 400 and 600° C., more preferably between 525 and 575° C., and a pressure between 10 and 760 Torr, more preferably between 10 and 200 Torr. In some embodiments, the temperature and/or pressure may fluctuate during the cyclical selective deposition process. For example, in one embodiment, pressure may vary during the cyclical selective deposition process. In other embodiments, it is typically more efficient to select conditions under which temperature or the pressure will remain constant during the process. In a preferred embodiment, both the temperature and the pressure will remain constant such that the cyclical selective deposition and etch process takes place under isothermal and isobaric conditions, which helps to ensure a high throughput.

During the deposition and etch processes, one or more carrier gases (such as $N_2$ or He) may flow. In some embodiments, the flow rate of the carrier gas may remain constant throughout the deposition and etch cycles. In other embodiments, the flow rate of the carrier gas may fluctuate, such that the flow rate may be ramped up (such as to 10-40 slm or more) and/or down (such as to 1-5 slm or less). In one embodiment, the carrier gas will be $H_2$ and will flow continuously during the deposition and etch processes at a flow rate between 5 slm and 10 slm.

In one embodiment, an etchant will be introduced at the same time as the introduction of a first pulse of a deposition precursor. In another embodiment, an etchant will be introduced prior to the introduction of a first pulse of a deposition precursor. When the etchant is introduced prior to the introduction of a first pulse of a deposition precursor, the etchant may be introduced between 1 and 20 seconds, more preferably, between 3 and 10 seconds after wafer temperature stabilization and before deposition precursors are started. An etchant (e.g., HCl) according to one embodiment of the present application for a 300-mm, single-wafer system, may have a flow rate between 2 and 2000 sccm, more preferably between 5 and 600 sccm.

An etchant may be introduced into a processing chamber with a reducing carrier gas such as $H_2$, or an inert carrier gas such as He, Ar or $N_2$. The carrier gas will be introduced into the chamber with the etchant at a flow rate of between 1 and 30 slm, more preferably between 2 and 20 slm. The carrier gas, like the etchant, may be introduced prior to the introduction of the first pulse of deposition vapor. In one example, both an etchant, such as $Cl_2$ or HCl and a carrier gas, such as $H_2$, He or $N_2$ are introduced 5 seconds before introducing a first pulse of a deposition vapor.

In accordance with FIG. 1, a pulse of a silicon-containing source vapor is introduced 30 to at least partially selectively deposit silicon-containing material in the substrate recess while maintaining continuous etchant flow. In some embodiments, the selectivity will be perfect such that net deposition occurs only in a desired region, such as in a semiconductor recess with no net deposition in other regions, such as on field isolation regions. In other embodiments, the selective deposition may be imperfect (e.g., partially selective) such that deposition occurs in areas besides the desired region, such as on insulators adjacent to the semiconductor recess. For example, a pulse of a silicon-containing source vapor may result in the deposition of non-epitaxial (polycrystalline or amorphous) material on exposed insulator regions. Such imperfect or partial selectivity during the deposition phase is acceptable in the present application as the continuous flow of etchants helps to control the growth of such non-epitaxial material to be thinner over insulators or other non-crystal material, and between deposition pulses 30 continued etchant flow 20 removes the remainder of the non-epitaxial material while leaving some of the epitaxial deposition in the single crystal window or recess. The overall result of the cyclical process can be perfectly selective formation even if only partially selective deposition occurs in the deposition phase.

A first pulse of a silicon-containing source vapor may be introduced into a processing chamber at the same time as the initial introduction of a first etchant, or after the preliminary introduction of an etchant into the chamber for a pre-deposition cleaning period. The pulse is conducted for a period of time to allow for at least some net epitaxial deposition on exposed single-crystal surfaces, such as the substrate recess.

The duration of a single pulse of a silicon-containing source vapor may be between 2.4 and 30 seconds, preferably between 3.6 and 6 seconds. The period in which a pulse of a silicon-containing source vapor flows along with the continuous etchant flow is herein referred to as a "deposition phase."

The silicon-containing source vapor may comprise, but is not limited to, one or more of the following sources, including silane ($SiH_4$), dichlorosilane or DCS ($SiCl_2H_2$), disilane ($Si_2H_6$), monochlorodisilane (MCDS), dichlorodisilane (DCDS), trisilane ($Si_3H_8$), or 2,2-dichlorotrisilane. The silicon-containing source vapor may be introduced into a processing chamber during the continuous etchant flow by itself, forming a layer of epitaxial silicon-containing material on a recess substrate. In some embodiments, the Si-containing source vapor will be introduced along with a germanium source, a carbon source, an electrical donor or acceptor dopant source, a tin source or combinations thereof. In embodiments in which a silicon-containing source vapor is introduced with a germanium source, a layer of silicon germanium may be deposited on the substrate recess. For embodiments that include a carbon source, such as monomethyl silane (MMS), a silicon-containing layer having carbon will be deposited, such as carbon-doped silicon or carbon-doped silicon germanium. For embodiments that include a dopant source, such as phosphine ($PH_3$) or arsine ($AsH_3$), a layer incorporating a dopant will be deposited on the substrate recess, such as phosphorous-doped silicon carbon or arsenic-doped silicon carbon for NMOS devices. As is known in the art, tensile strain exerted by Si:C can improve NMOS transistor performance.

In accordance with FIG. 1, after a period of at least partially selective epitaxial growth during a deposition phase, the flow of the silicon-containing source vapor is stopped 40, thus allowing for a period of continued etchant flow in which no material deposition occurs. In contrast to the deposition phase, the period of continuous etchant flow in which no Si-source vapor flows is herein referred to as an "etch phase."

Figure 2B:
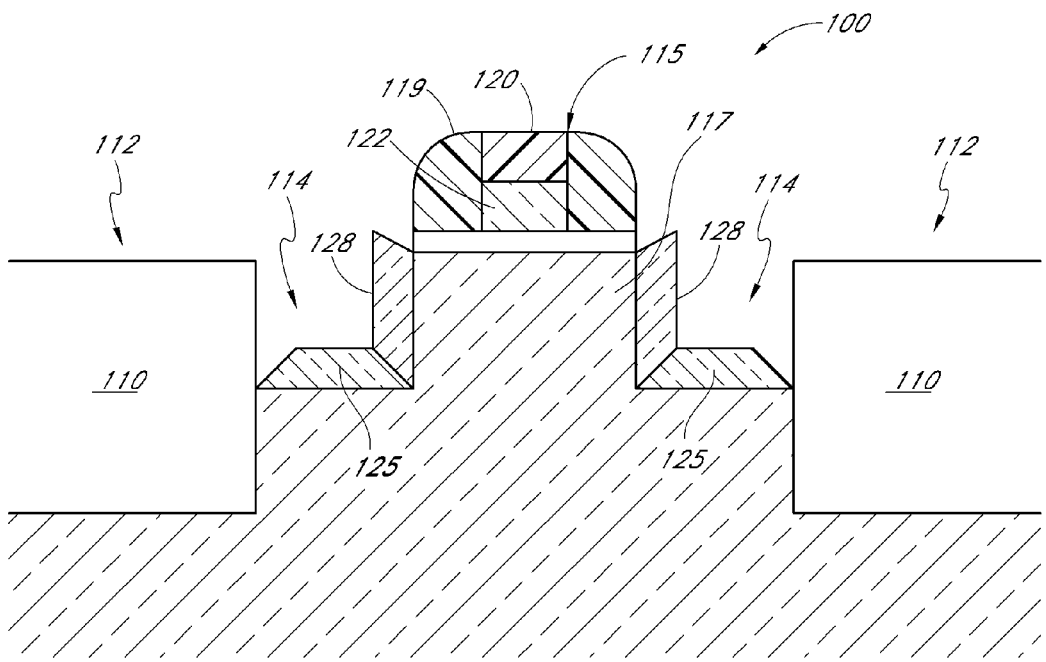
FIG. 2B shows the semiconductor substrate of FIG. 2A immediately following a first deposition phase in which a pulse of a silicon-containing source vapor is provided while flowing etchant according to one embodiment of the present application.
Figure 3A:
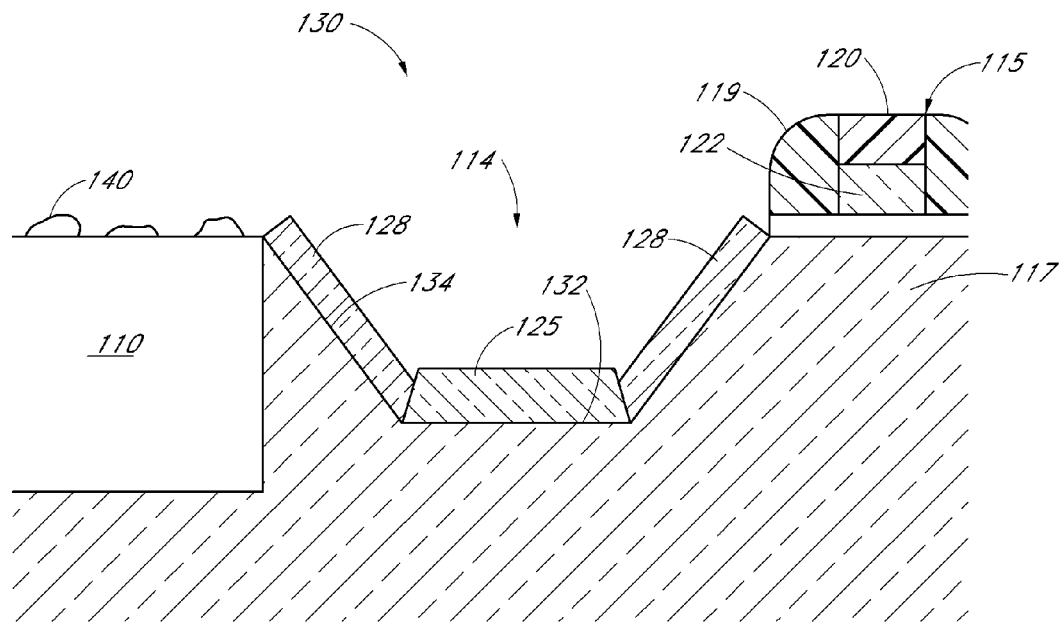
FIG. 3A shows a schematic view of a semiconductor substrate having a recess comprised of a <100> floor and <111> slanted facets or sidewalls immediately after performing a first deposition phase while flowing etchant according to one embodiment of the present application.

During an etch phase, deposited material is removed from exposed surface areas. For embodiments in which deposition 30 is perfectly selective such that epitaxial material is deposited only in the substrate recess, the etchants during the etch phase will remove portions of the deposited epitaxial material (from the prior pulse 30 of precursors) from the recess. In embodiments in which the deposition phase 30 is partially selective, in which epitaxial deposition occurs in the recess while reduced non-epitaxial growth occurs in adjacent regions (as shown in FIGS. 2B and 3A), etchants will remove both portions of the deposited epitaxial material from the recess and remaining non-epitaxial material from adjacent regions during the etch phase.

After stopping 40 the flow of silicon-containing source vapor, one skilled in the art may assess whether the desired thickness of deposited silicon-containing material in the recess has been achieved 50. Upon achieving a desired thickness of deposited silicon-containing material, the selective formation process may end 60. If a desired thickness of deposited silicon-containing material is not achieved after performing a first deposition phase, a pulse of a silicon-containing source vapor may once again be introduced 30 to increase the thickness of the deposited silicon-containing material. At least two pulses 30 of deposition are performed in cycles. In some embodiments, introducing a pulse of a silicon-containing source vapor may be repeated two, three, four, five, six, seven or more times, all while maintaining continuous etchant flow, until a desired thickness of deposited silicon-containing material is achieved. In some embodiments, introducing a pulse of a silicon-containing source vapor can be conducted between 20 and 100 times.

Figure 2A:
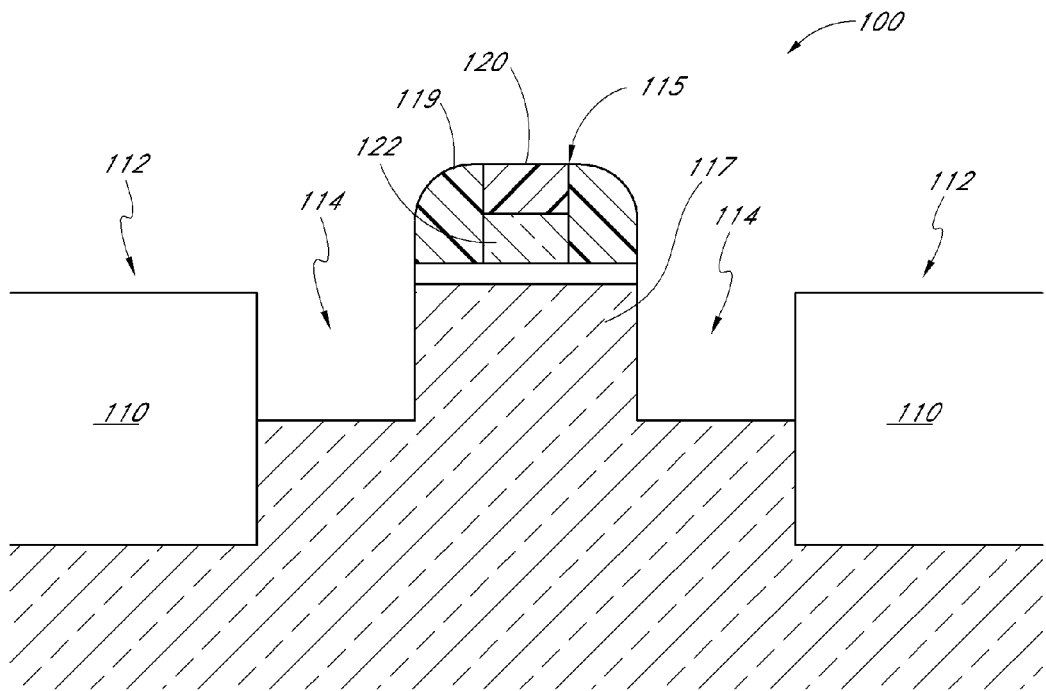
FIG. 2A shows a schematic view of a semiconductor substrate having source and drain recesses and a gate electrode structure thereover.

FIG. 2A provides a schematic illustration of a semiconductor device 100 having source and drain recesses 114. The semiconductor device 100 includes patterned insulators 110 formed in a semiconductor substrate, such as a silicon wafer. The illustrated insulators 110, in the form of oxide-filled shallow trench isolation (STI), define field isolation regions 112 and are adjacent recessed source and drain regions 114 shown on either side of an insulated gate electrode structure 115. The recessed source and drain regions 114 include a base (e.g., Si <100>) and vertical sidewalls (e.g., Si <110>). The insulated gate electrode structure 115 comprises a doped semiconductor or metal gate 122 surrounded by gate insulators 119 and 120. The insulated gate electrode structure 115 overlies a channel region 117 of the substrate. The channel region 117, along with the source and drain regions 114, define a transistor active area, which is typically surrounded by field isolation regions 112 to prevent cross-talk with adjacent devices. Multiple transistors for an integrated circuit are separated by field isolation regions 112. In one embodiment, the top of the gate electrode structure 115 can be capped with a dielectric material 120. This surface may then behave similarly to the field isolation regions 112 with respect to the deposition thereover, and any deposition over the top of the gate may have a similar crystallinity as the deposition over the field isolation regions 112. In embodiments in which the gate 115 is not capped with a dielectric material, the surface of the gate may grow polycrystalline material during the selective deposition phases, in which case the polycrystalline material can be removed through in-situ etching of the non-epitaxial material.

As noted above, prior to beginning any deposition, one or more vapor phase etchants may be introduced. In one embodiment, a vapor phase etchant (e.g. HCl, $Cl_2$) may be introduced continuously at a flow rate between 5 and 2000 sccm. For example, in one embodiment, a vapor phase etchant comprising $Cl_2$ flows between 5 and 200 sccm. In addition to the vapor phase etchant, a carrier gas may be introduced during the continuous etchant flow, at a flow rate between 1 and 30 slm. In one embodiment, a carrier gas comprising $H_2$ flows during a continuous etchant flow at a flow rate between 2 and 20 slm.

FIG. 2B shows the semiconductor substrate of FIG. 2A immediately following a first deposition phase in which a pulse of a silicon-containing source vapor is provided during a continuous flow of etchant according to one embodiment of the present application. During the first deposition phase, epitaxial material is deposited along both the base and sidewalls of the recesses 114. In a preferred embodiment, the epitaxial material 125 that is deposited on the base of the recess (e.g., Si <100>) is carbon-doped silicon, predominantly defect free and of better quality that the epitaxial material 128 deposited on the vertical recess sidewalls (e.g., Si <110>).

In addition, non-epitaxial material 126 (e.g., amorphous or polycrystalline) is deposited on the gate electrode structure 115 during the deposition phase. Non-epitaxial material 131 is also deposited on the insulators 110 in the field isolation regions 112. The illustrated embodiment thus shows a deposition process having partial selectivity, in, which material growth occurs on regions adjacent to the source and drain regions. For such embodiments in which there is both non-epitaxial and epitaxial growth during the deposition phase, the non-epitaxial material may be removed at a faster rate than the epitaxial material during the subsequent etch phase. In alternate embodiments, the deposition phase is completely selective such that epitaxial layers form only in source and drain recesses and not in adjacent areas.

During the first deposition phase, a pulse of a silicon-source vapor is introduced. The silicon-source vapor may be selected from silane ($SiH_4$), dichlorosilane or DCS ($SiCl_2H_2$), disilane ($Si_2H_6$), monochlorodisilane or MCDS ($Si_2H_5Cl$), dichlorodisilane or DCDS ($Si_2H_4Cl_2$), trisilane ($Si_3H_8$), and 2,2-dichlorotrisilane. In one embodiment, the duration of a single pulse of a silicon-containing source vapor between 2.4 and 12 seconds. The silicon-source vapor will have a flow rate between 25 and 500 mg/min, preferably between 100 and 300 mg/min, for a liquid precursor, such as $Si_3H_8$, and will result in deposited epitaxial growth 125, 128 in the source and drain recesses 114, on both the base and sidewalls of the recesses 114. As illustrated in FIG. 2B, the epitaxial material 125 grows at least partially selectively and conforms to the base and sidewalls of the source/drain recesses 114.

In addition to the silicon-source vapor, a dopant source may be introduced in situ during the deposition phase to incorporate electrically active dopants into the silicon-containing films by chemical vapor deposition. Typical n-type dopant sources include arsenic vapor and dopant hydrides, such as phosphine ($PH_3$) and arsine ($AsH_3$). Silylphosphines, for example $(H_3Si)_{3-x}PR_x$, and silylarsines, for example, $(H_3Si)_{3-x}AsR_x$, where x=0, 1 or 2 and $R_x$=H and/or deuterium (D), are alternative precursors for phosphorous and arsenic dopants. Phosphorous and arsenic are particularly useful for doping source and drain areas of NMOS devices. Such dopant precursors are useful for the preparation of films as described below, preferably phosphorous-, antimony-, indium-, and arsenic-doped silicon, Si:C, and SiGe:C films and alloys.

Typical p-type dopant precursors include diborane ($B_2H_6$) and boron trichloride ($BCl_3$) for boron doping. Other p-type dopants for Si include Al, Ga, In, and any metal to the left of Si in the Mendeleev table of elements. Such dopant precursors are useful for the preparation of films as described below, preferably boron-doped silicon, SiGe, and SiGe:C films and alloys.

The dopant source (which may be diluted, for example, to 1% in $H_2$ or He) may be introduced at a flow rate between 50 sccm and 1000 sccm, more preferably between 100 sccm and 300 sccm. For example, in one embodiment, phosphine ($PH_3$) diluted to 1% in He can be introduced with a carbon source precursor and silicon source precursor during a deposition phase at a flow rate between 5 and 500 sccm, resulting in the epitaxial growth of a phosphorous-doped silicon film. According to some embodiments, the phosphorous-doped silicon film will be tensile strained. One skilled in the art will appreciate that using dopants besides phosphorous will result in doped films having different material properties and growth rates on different crystalline planes.

In addition to the silicon-source vapor and dopant source, a carbon source may also be provided during the deposition phase, resulting in the deposition of carbon doped silicon. The carbon source may comprise silylalkanes such as monosilyl-methane, disilylmethane, trisylmethane and tetrasilyl-methane, and/or alkylsilanes such as monomethyl silane (MMS) and dimethyl silane. In some embodiments, a carbon source comprises $H_3Si—CH_2—SiH_2—CH_3$ (1,3-disilabutane). The carbon source may be introduced at a flow rate between 25 and 500 sccm, more preferably between 50 and 200 sccm. For example, in addition to a silicon-source vapor source, monomethyl silane (MMS) may be introduced at a flow rate between 50 and 200 sccm such that carbon atoms are incorporated into the deposited epitaxial material, thus forming carbon-doped silicon epitaxial films in the recesses. Such carbon doped silicon films may have a high substitutional carbon concentration, between 1 atomic % and 3 atomic %. In a preferred embodiment, a silicon-source vapor, monomethyl silane and phosphine will be added to deposit a phosphorous doped silicon carbon film.

The epitaxial material that is deposited may vary depending on the silicon-source vapor precursor that is used, as well as chamber conditions. The epitaxial material may be tensilely or compressively strained. Tensile strained materials may include, without limitation, carbon-doped silicon films and silicon germanium films in which the germanium concentration is less than about 8-10 times the carbon concentration. Compressively strained materials may include, without limitation, silicon germanium films and carbon-doped silicon germanium films in which the germanium concentration is greater than about 8-10 times the carbon concentration, as well as silicon germanium tin and germanium tin films.

Figure 2C:
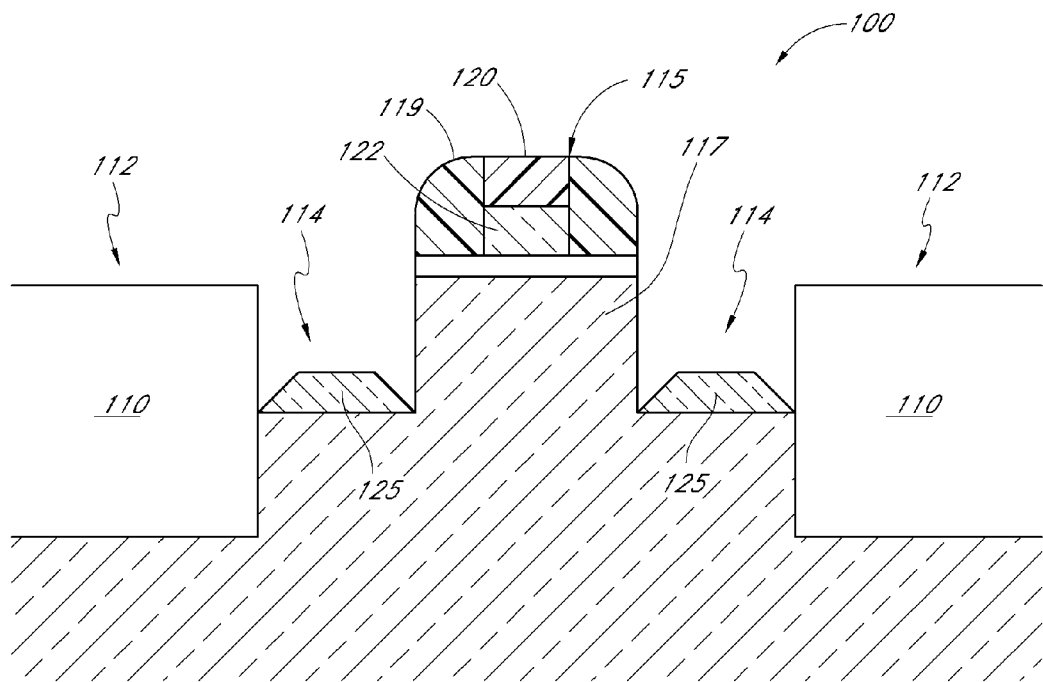
FIG. 2C shows the semiconductor substrate of FIG. 2B after stopping the first deposition phase and continuing flow of etchant according to one embodiment of the present application.

FIG. 2C shows the semiconductor substrate of FIG. 2B after completion of the first deposition phase and after allowing the etchant to flow between deposition pulses for a certain duration as part of an etch phase according to one embodiment. The non-epitaxial material 126 and 131 shown in FIG. 2B has been completely removed from over insulators. While some epitaxially deposited silicon-containing material is removed from the lower epitaxial layer 125 in the recessed source and drain regions 114 during the etching phase, at least some of the lower epitaxial layer 125 remains. The sidewall epitaxial layer 128 grows over a different crystallographic plane and tends to grow slower (due to a lower dangling bond density of around 0.71 times the dangling bond density of the lower epitaxial layer) and/or be more defective than the lower epitaxial layer 125. In a preferred embodiment, defective or thinner epitaxial material is removed during the etch phase, and accordingly, the sidewall epitaxial layer 128 is more readily removed than the lower epitaxial layer 125.

Each deposition phase and etch phase may thus be viewed as a selective formation cycle that can be tuned to eliminate net growth on recess sidewalls while achieving net growth in the recess in a bottom-up fashion. The net epitaxial growth in the recess may have a thickness between 0.5 and 6 nm per cycle, more preferably between 1 and 3 nm per cycle.

In some embodiments, the etchant may be comprised of a halide, such as a fluorine-, chlorine-, bromine- or iodine-containing vapor compound. The etchant may have a flow rate between 5 and 2000 sccm. For example, in one embodiment, the etchant is comprised of a chlorine source, such as HCl or $Cl_2$ that flows continuously between 5 and 1000 sccm. Depending on the etchant used, the preferred flow rate may vary. For example, with HCl etchant, the preferred flow rate is between 200 and 2000 sccm. With $Cl_2$ etchant, the preferred flow rate is between 50 and 200 sccm for a single wafer epitaxial CVD reaction. In some embodiments, the etch chemistry may also contain a germanium source, such as monogermane ($GeH_4$) or digermane ($Ge_2H_6$). The Ge precursors may be metallorganic. In some embodiments, the germanium source may flow at a rate between 10 and 500 sccm, more preferably between 50 and 200 sccm. For example, in one embodiment, a monogermane ($GeH_4$ diluted to 10%) source will be provided during the etchant flow at a flow rate of between 50 and 200 sccm.

Figure 2D:
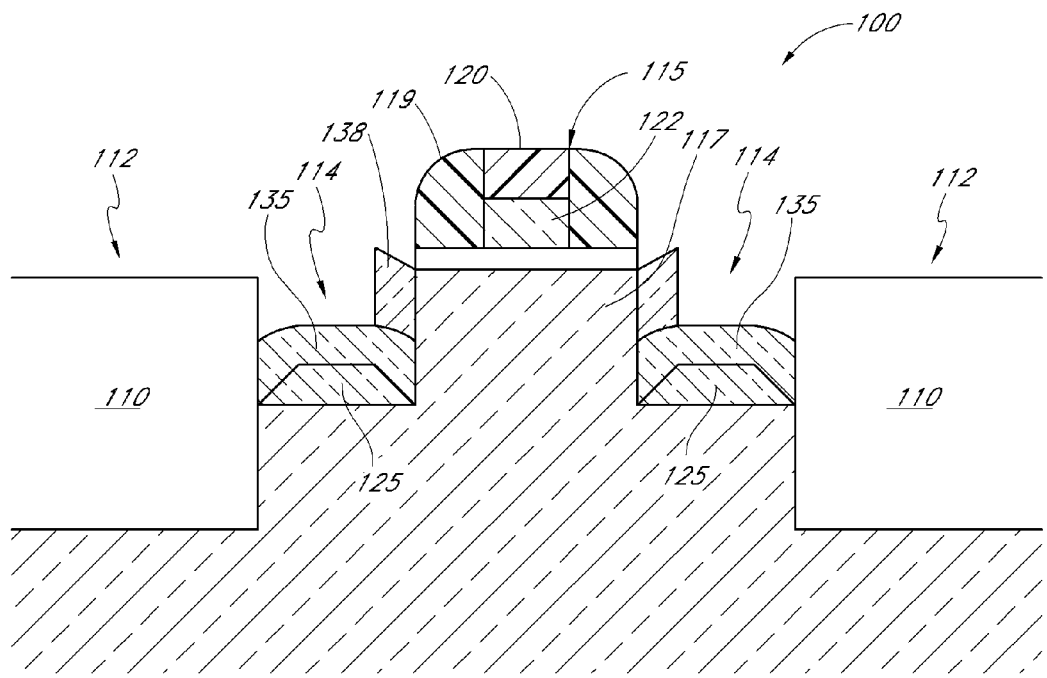
FIG. 2D shows the semiconductor substrate of FIG. 2C immediately following a second deposition phase in which a second pulse of a silicon-containing source vapor is provided while flowing etchant according to one embodiment of the present application.

FIG. 2D shows the semiconductor substrate of FIG. 2C immediately following a second deposition phase in which a second pulse of a silicon-containing source vapor is provided during the continuous etchant flow according to one embodiment of the present application. The second pulse deposits additional epitaxial material in the recesses 114 over the deposited epitaxial layer 125, as illustrated by epitaxial layer 135, as well as epitaxial growth on the recess sidewalls 138. Like the first pulse, the second pulse results in a layer of non-epitaxial material 136 on the gate electrode structure 115, as well as a layer of non-epitaxial material 131 on the insulators 110. While illustrated as a discontinuous layer, the non-epitaxial material 131 may be continuous.

Epitaxial layer 135 may have a different material composition from epitaxial layer 125. In one embodiment, both epitaxial layers 125 and 135 are of the same material composition and possess uniform properties, such that it is difficult to distinguish one layer from another. In other embodiments, epitaxial layers 125 and 135 may be of different material composition such that each layer is a discrete layer with its own properties. In some embodiments, the layers may be graded such that upper deposited material layers have a greater strain than lower deposited material layers, such that a graded stressor having a maximum strain at a top surface is achieved, as disclosed in FIG. 5C and paragraph [0043] of U.S. patent application Ser. No. 11/858,054, entitled "STRESSOR FOR ENGINEERED STRAIN ON CHANNEL," filed Sep. 19, 2008. This higher degree of strain in epitaxial layer 135 over epitaxial layer 125 may be created, for example, by providing different levels of strain-inducing dopants (e.g., carbon), such that there is higher strain at the top layer 135 that extends to the sidewalls of the recesses 114 as shown in FIG. 2D.

Figure 2E:
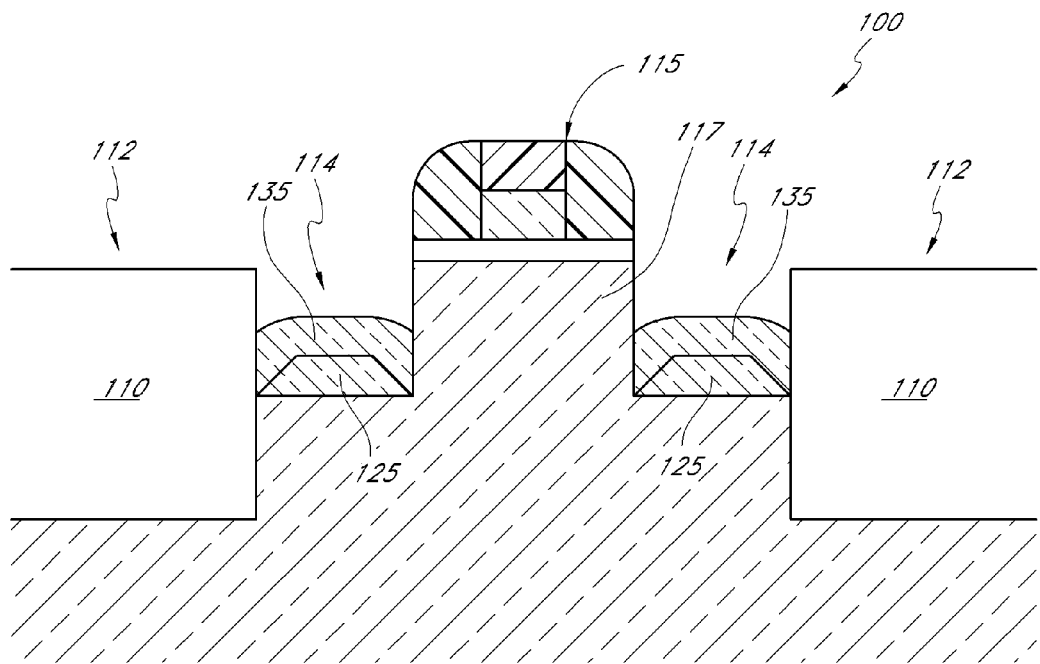
FIG. 2E shows the semiconductor substrate of FIG. 2D after stopping the second deposition phase and continuing etchant flow according to one embodiment of the present application.

FIG. 2E shows the semiconductor substrate of FIG. 2D after stopping the second deposition phase and allowing the continuous etchant flow to proceed for a certain period. Non-epitaxial material 136 and 131 shown in FIG. 2D has been completely removed from over the insulators. While some epitaxially deposited silicon-containing material is removed from the exposed epitaxial layer 135 in the recessed source and drain regions 114 during the etching phase, at least some of the second lower epitaxial layer 135 remains. Epitaxial material is once again removed completely from recess sidewalls, allowing only for continued bottom-up growth to remain in the recesses 114.

Figure 2F:
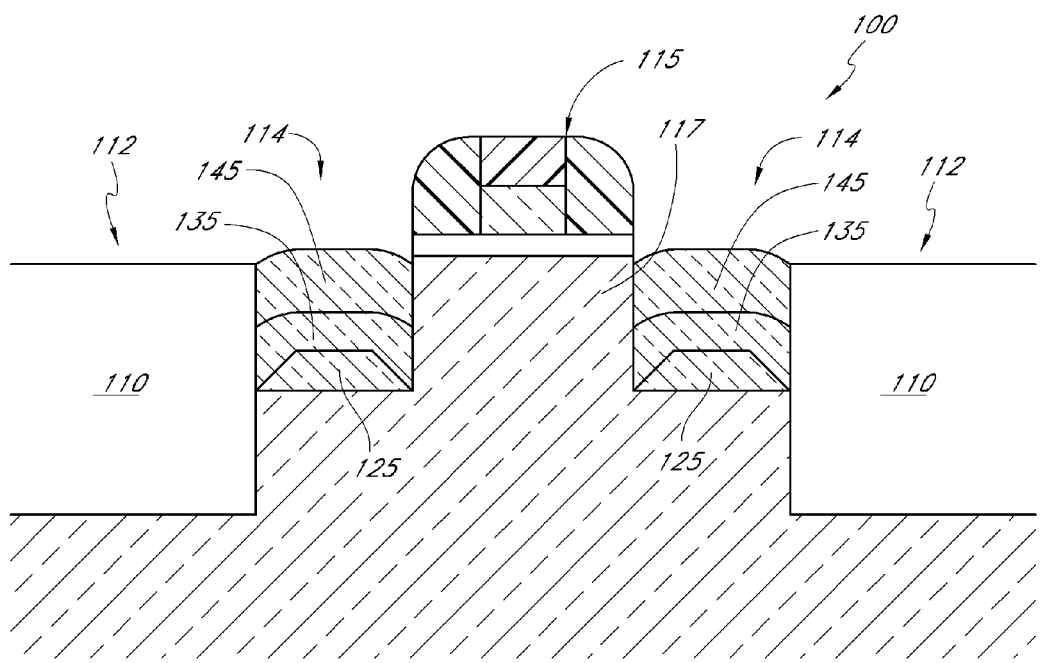
FIG. 2F shows the semiconductor substrate of FIG. 2E after performing and stopping a third deposition phase and while flowing etchant according to one embodiment of the present application.
Figure 2G:
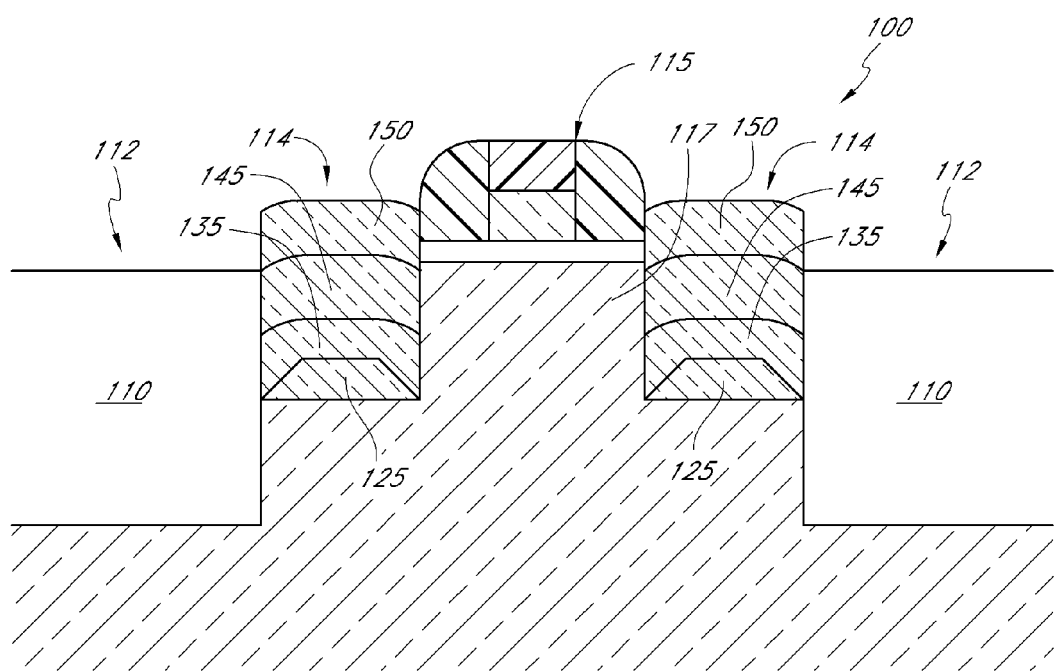
FIG. 2G shows the semiconductor substrate of FIG. 2F after performing and stopping a fourth deposition phase while flowing etchant flow to proceed for a certain duration according to one embodiment of the present application.

FIG. 2C thus shows the result of one cycle of at least partially selective deposition and selective etch back. If insufficient, a second cycle is conducted shown in FIG. 2E. Such cycles can be repeated two or more times until a desired thickness of epitaxial material is achieved in the recessed source/drain regions 114. For example, one skilled in the art may choose to repeat the cycle of deposition and etch back three times, such that a third layer 145 of epitaxial material is deposited above the first layer 125 and second layer 135 as shown in the illustrated embodiment in FIG. 2F. Or, one skilled in the art may choose to repeat a deposition phase and etch phase cycle four times, such that a fourth layer 150 of epitaxial material is deposited above the first layer 125, the second layer 135, and the third layer 145, as shown in the illustrated embodiment in FIG. 2G. FIG. 2G shows raised source/drain regions 114, though of course the process can be stopped when the recesses are filled. Depending on the number of deposition phases needed to achieve a desired epitaxial thickness, the duration of the total selective epitaxial process may last for a total duration between 120 and 900 seconds (or 2 to 15 minutes).

The skilled artisan will appreciate that FIGS. 2A-2G are schematic only and that the number of cycles to fill or overfill the recesses may vary, depending upon the relative durations and flow rates of each phase and the dimensions of the recesses. These parameters can be selected, e.g., to optimize bottom-up growth by periodic removal of defective sidewall growth. System instability and inefficiency is ameliorated by maintaining etchant flow during the cycles.

FIG. 3A shows a cross-sectional view of a transistor structure comprising a semiconductor substrate 130 having a recess with sloped sidewalls, immediately after performing a first selective deposition according to one embodiment. The semiconductor substrate 130 comprises recessed source/drain region 114 having a flat bottom surface 132 with a first crystalline plane <100> and recess facets or sidewalls 134 having a second crystalline plane <111>. The recess 114 is adjacent to an insulator 110 and a channel region 117 of the semiconductor substrate having an overlying gate electrode structure 115.

FIG. 3A shows epitaxial growth 125, 128 in the semiconductor recess, on both the flat bottom surface 132 and recess sidewalls 134, as well as growth of non-epitaxial material 140 on the field isolation region 110, as a result of a first deposition phase of a silicon-containing source vapor. In addition, non-epitaxial growth 150 occurs on the gate electrode structure 115. In one embodiment, prior to the first deposition, an etchant flow may have been introduced for a period between 3 and 10 seconds. After the first deposition, the bottom epitaxial growth 125 that occurs along the <100> horizontal floor is similar to the growth of the first epitaxial layer shown in FIGS. 2A-2G. The sidewall epitaxial growth 128 that occurs along the <111> slanted facet 134 differs, however, from the growth on the recess sidewall shown in prior embodiments due to a difference in the crystalline orientation of the <111> sloped sidewall of FIG. 3A. As shown in the illustrated embodiment, the growth rate is generally higher on <100> crystalline surfaces than on <111> crystalline surfaces. Accordingly, silicon-containing material will be selectively deposited faster on the <100> horizontal facet than on the <111> slanted facet, resulting in a greater thickness of epitaxial material on the <100> horizontal facet than on the <111> slanted facet. In one embodiment, the silicon-containing material that is deposited comprises carbon-doped silicon (Si:C).

While in some embodiments an at least partially selective deposition phase will result in perfect selectivity in which epitaxial growth occurs only in desired areas, such as in the formed recesses, the embodiment illustrated in FIG. 3A shows imperfect or partial selectivity in which non-epitaxial growth 140 (e.g., amorphous or polycrystalline material) also occurs above the exposed surface of the insulator 110 and non-epitaxial growth 150 occurs over the insulated gate electrode structure 115. In some embodiments, a ratio of the rate of deposition of non-epitaxial growth on the insulator to the rate of deposition of epitaxial material on the semiconductor material during a deposition phase is between 0:1 and 1:2. The non-epitaxial material 140 and 150 may be removed in a subsequent etch phase by the continued etchant flow, leaving epitaxial material only in desired regions.

As shown in FIG. 3A, the thickness of the non-epitaxial material 140 on the insulator 110 is generally less than that of the epitaxial material 125 and 128 shown in the recess. Similarly, the thickness of the non-epitaxial material 150 on the gate electrode structure 115 is also generally less than that of the epitaxial material 125 and 128. In relation to each other, non-epitaxial layer 150 may be greater than or less than non-epitaxial layer 140, depending on the underlying material. The difference in thicknesses can be attributed in part to different nucleation rates that occur between the source vapor and different surface material (e.g., semiconductor and insulator material or different insulators). The differential effect of the presence of etchant during the deposition phase exacerbates any natural thickness difference due to the nucleation rates. In any event, due to selectivity, the thickness of the epitaxial layers 125, 128 are at least two times, preferably five times, and even more preferably at least ten times the thickness of either the non-epitaxial material 140 on the insulator and/or the non-epitaxial material 150 on the gate electrode structure 115, if any non-epitaxial material is formed after the selective deposition phase.

Figure 3B:
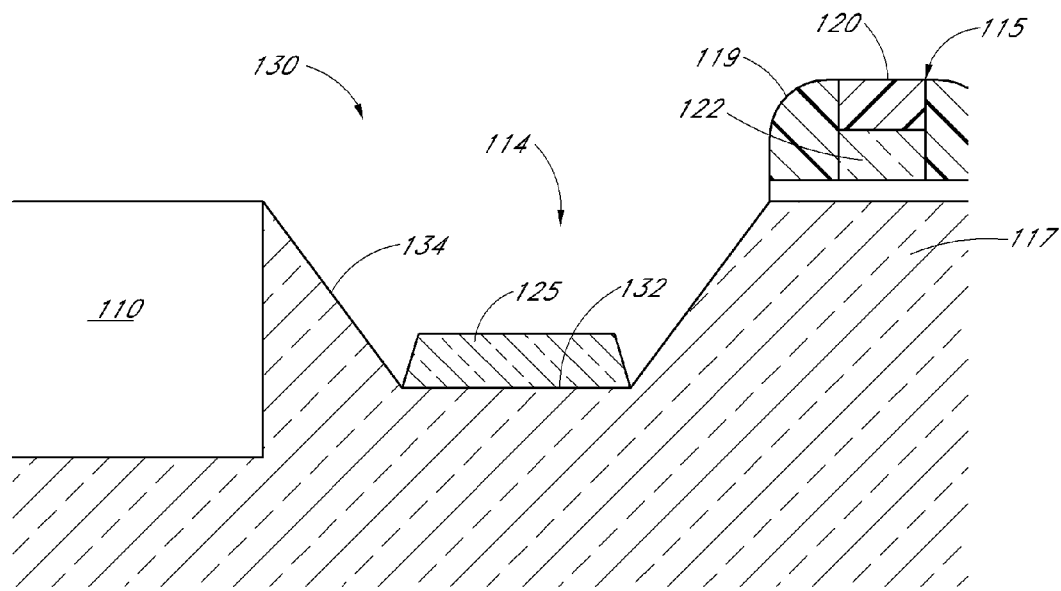
FIG. 3B shows the semiconductor substrate of FIG. 3A after stopping the first deposition phase and allowing continuing etchant flow according to one embodiment of the present application.

FIG. 3B shows the semiconductor substrate 130 of FIG. 3A after stopping the first deposition phase and allowing the flow of etchant to continue for a certain duration. During the etch phase, the etchant removes minimal portions of epitaxial growth on the <100> flat bottom surface of the recess. The epitaxial growth on the <111> recess sidewalls 134, the non-epitaxial growth 140 on the insulator sidewall region 110, and the non-epitaxial growth 150 on the gate electrode structure 115 are substantially or completely removed during the etch phase. The etch phase thus results in bottom-up growth of preferably defect-free epitaxial material in the recessed source/drain region 114.

Figure 3C:
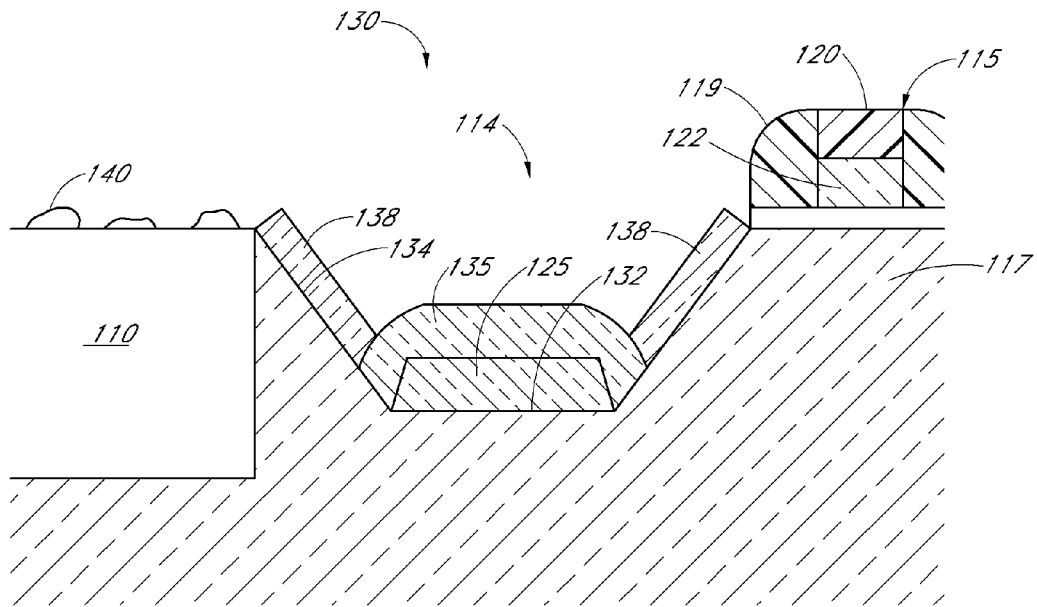
FIG. 3C shows the semiconductor substrate of FIG. 3B immediately after performing a second deposition phase while flowing etchant according to one embodiment of the present application.

FIG. 3C shows the semiconductor substrate 130 of FIG. 3B immediately after performing a second selective deposition phase according to one embodiment. The second deposition phase results in further growth of good quality second bottom epitaxial material 135 above the first bottom epitaxial material 125, in addition to lesser quality epitaxial growth 138 on the <111> recess sidewalls 134 and non-epitaxial growth 140 on the second sidewall insulator region 110. In addition, non-epitaxial growth 160 results on the gate electrode structure 115. As shown in the illustrated embodiment, the second bottom epitaxial material 135 overlies the first bottom epitaxial material 125.

Figure 3D:
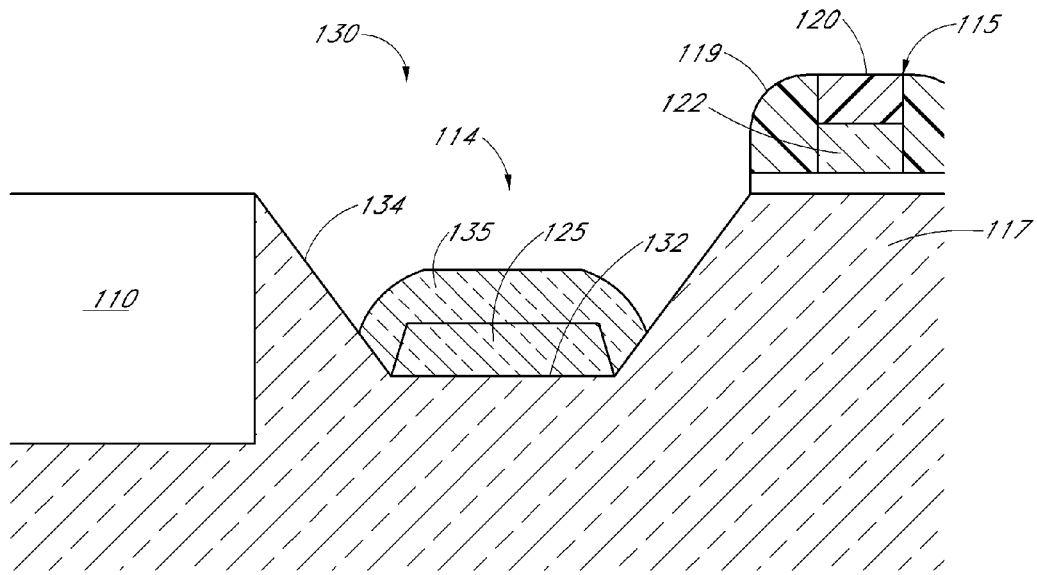
FIG. 3D shows the semiconductor substrate of FIG. 3C after stopping the second deposition phase and continuing etchant flow according to one embodiment of the present application.

FIG. 3D shows the semiconductor substrate 130 of FIG. 3C after stopping the second deposition phase and allowing the flow of etchant to continue for a certain duration according to one embodiment of the present application. Like the first etch phase illustrated in FIG. 3B, the etch phase illustrated in FIG. 3D results in minimal removal of good quality bottom epitaxial growth 135 while completely removing the non-epitaxial growth 140 on the insulator surfaces 110 and non-epitaxial growth 160 on the gate electrode structure 115. The sidewall epitaxial growth 138 on the <111> recess sidewalls 134 is also substantially or completely removed during the etch phase. The cycle of deposition phase and etch phase may be repeated until a desired thickness of bottom-up growth is achieved on the bottom of the recess. The upper layer(s) of the selectively formed epitaxial material contact the sidewalls of the recess, exerting a strain on the channel 117 of the semiconductor substrate that is beneficial to the electrical properties of the transistor device. While in some embodiments, the strain that is exerted by epitaxial material 135 is compressive, the illustrated embodiment produces Si:C and the strain that is exerted by epitaxial material 135 is tensile. For example, in one embodiment, the deposited material comprises a phosphorous doped silicon-carbon film layer having a high substitutional carbon content, as-deposited before any anneal, that exerts a tensile strain on the channel.

While the illustrated embodiment has recess sidewalls having a <111> crystalline plane, other embodiments may include recess sidewalls having different crystalline planes, including <110> and <113>. For embodiments that have a <110> vertical sidewall and <100> horizontal bottom, during deposition phases, the methods provided can result in deposition of silicon-containing material that is deposited faster on the <100> horizontal bottom than on the <110> vertical sidewall. In addition, during etchant phases, the methods provided can result in the removal of silicon-containing material faster on the <100> horizontal bottom than on the <110> vertical sidewall, resulting in an ideal selective process.

Figure 4:
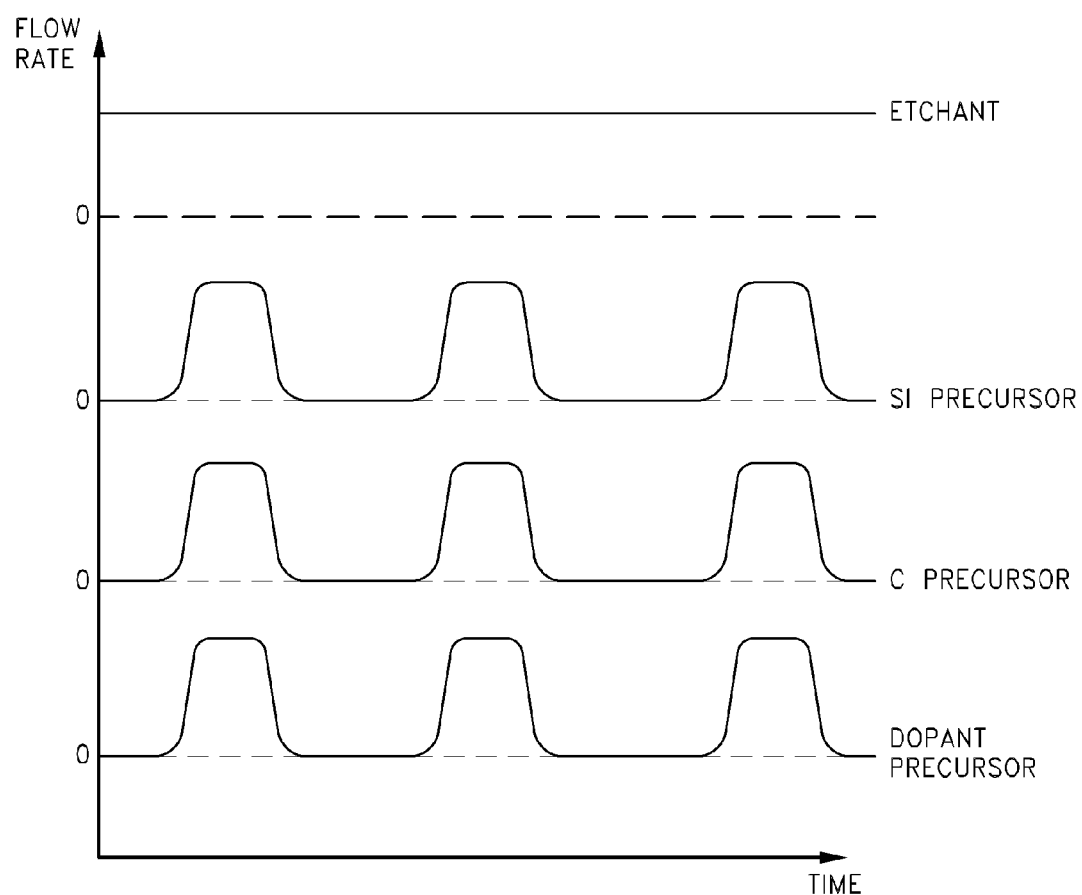
FIG. 4 shows a graph illustrating the flow rate of an etchant, silicon-precursor, carbon precursor and dopant precursor versus time according to one embodiment of the present application.

FIG. 4 shows a graph illustrating the flow rate of an etchant, silicon-precursor, carbon precursor and dopant precursor versus time according to one embodiment. In this embodiment, the etchant flow rate is continuous and is also kept constant. In other embodiments, the etchant flow rate may vary within a specific range.

In the embodiment shown in FIG. 4, a silicon precursor, carbon precursor and dopant precursor are all introduced at the same time and for a similar duration in each pulse. In other embodiments, it is possible that one or more of the carbon precursors or dopant precursors will be omitted or of lesser flow rate during early deposition phases of a silicon precursor, such that subsequently deposited layers may differ from underlying deposited layers (e.g., the composition of the overall stressor may be graded).

EXAMPLE PROCESS PARAMETERS

Example 1

Example process parameters are summarized in Table A below, which lists operating ranges for a selective deposition process according to one embodiment using either $Cl_2$ or HCl as an etchant gas. Optional ranges are provided in parentheses. As is evident from Table A, the process conditions such as chamber temperature, chamber pressure and carrier gas flow rates, are preferably substantially similar throughout the selective deposition process, thereby allowing throughput to be increased. Thus, the example below employs isothermal and isobaric conditions during the selective formation process.

TABLE A

| | Process Phase | | | | |
|---|---|---|---|---|---|
| | Pre-Deposition (one time at beginning) | Selective Epitaxial Growth (SEG) | Etch Back | Transition Period to Selective Epitaxial Growth (SEG); repeat x-times | Post-Etch Purge (one time at end) |
| duration (sec) | 5 | 2.4-12 | 2.4-30 | .1 s | 10 |
| temp (° C.) | 525-600 | 525-600 | 525-600 | 525-600 | 525-600 |
| pressure (Torr) | 10-200 | 10-200 | 10-200 | 10-200 | 10-200 |
| $H_2$/He flow (slm) | 2-20 | 2-20 | 2-20 | 2-20 | 2-20 |
| $Cl_2$/HCl flow (sccm) | 5-600 | 5-600 | 5-600 | 5-600 | 5-600 |
| $GeH_4$ flow (sccm) | | (3-24) | (50-200) | (3-24) | |
| Si-source flow (sccm or mg/min) | | 50-200 | — | — | |
| MMS flow (sccm) | | 50-200 | — | — | |
| $PH_3$ flow (sccm) | | 5-200 | — | — | |

As shown in Table A, an etchant may be introduced into a chamber along with a carrier gas for a certain period before introducing the first pulse of silicon-source gas in what is referred to in the table as a "pre-deposition" stage. The pre-deposition stage may occur for approximately 5 seconds. This pre-deposition stage is optional. During the pre-deposition stage, an etchant such as $Cl_2$ or HCl is introduced along with a carrier gas such as $H_2$ or He. The optional pre-deposition stage occurs only once before introducing the first pulse of a silicon-source flow.

After pre-deposition, a silicon-source flow, an MMS flow and a $PH_3$ flow may be introduced while maintaining continuous etchant flow for between 2.4 and 12 seconds to deposit epitaxial material. During the deposition phase, etchant introduced during the pre-deposition stage continues to flow with the silicon-source so as to cause at least partially selective epitaxial growth (SEG).

Following the period of selective epitaxial growth, the Si-source flow, MMS flow and $PH_3$ flow may be stopped, allowing an etch back process to proceed for between 2.4 and 30 seconds to etch away non-epitaxial material and most or all epitaxial material of low quality, such as on recess sidewalls. In some embodiments, one may choose to add a germanium source flow, such as $GeH_4$, during the etch back to enhance the etch rate of the amorphous film by 5-100 times. The selective epitaxial growth and etch back processes comprise a cycle that can be repeated x-number of times until a desired amount of epitaxial growth results. As shown in the illustrated embodiment, there is no need to have a purging process in between silicon-source pulses. However, in some embodiments, the etch back phase is followed by a transition period of two seconds or less before returning back to the selective epitaxial growth (SEG) phase.

After the etch back process, a post-etch purge may occur, as listed in Table A, in order to adjust process parameters (e.g., to remove any $GeH_4$ gas that may be present). The post-etch purge can occur for approximately 10 seconds.

Based on the process parameters in Table A, it is possible to achieve high quality epitaxial Si:C:P films in source and drain recesses. In some embodiments, the Si:C:P films will have a substitutional carbon content between about 1 and 3%, and preferably between 1.5 and 2.5%. By manipulating deposition conditions, it is possible to obtain other film properties.

Example 2

Example process parameters are summarized in Table B below, which lists operating ranges for a selective deposition process according to one embodiment using HCl as an etchant gas. Optional ranges are provided in parentheses. As is evident from Table B, the process conditions such as chamber temperature and chamber pressure, are preferably substantially similar throughout the selective deposition process, thereby allowing throughput to be increased. Thus, the example below employs isothermal and isobaric conditions during the selective formation process.

TABLE B

|  | Pre-Deposition (once at beginning) | Deposition | Purge 1 | Purge 2 | Etch | Purge 3 | Purge 4 | Transition Period to Deposition (repeat 30 times) |
|---|---|---|---|---|---|---|---|---|
| Time [s] | 30 | 3.6 | 3.6 | 2.4 | 6 | 3.6 | 2.4 | 0.1 |
| Purpose |  | SiCP(Ge) dep | Purge out Si3H8, MMS, PH3 | Ramp down He |  | Etch Ge with high HCL/low He | Ramp up He |  |
| Token | Dep | Dep | Dep | Dep | Dep | Dep | Dep | Dep |
| Temp [° C.] | 525 | 525 | 525 | 525 | 525 | 525 | 525 | 525 |
| Pressure [Torr] | 200 | 200 | 200 | 200 | 200 | 200 | 200 | 200 |
| He [slm] | 10 | 10 | 10 | 2 | 2 | 2 | 10 | 10 |
| Si3H8 [mg/min] | 100V | 100 | — | — | — | 100V | 100V | 100V |
| MMS [sccm] | 60V | 60 | 60V | 60V | 60V | 60V | 60 | 60 |
| PH3 [sccm] | 150V | 150 | 150V | 150V | 150V | 150V | 150 | 150 |
| DCS [sccm] | 20 | — | — | — | — | — | — | — |
| HCl [sccm] | 200R | 200 | 200 | 200 | 200 | 200 | 200 | 200 |
| GeH4 [sccm] | 3-6V | 3-6 | 3-6 | 50-100R | 50-100 | 3-6 | 3-6 | 3-6 |

Like the embodiment in Table A, the illustrated embodiment in Table B includes an optional pre-deposition stage that need only occur once prior to the first deposition phase. The pre-deposition stage takes place for approximately 30 seconds. During the pre-deposition stage, dichlorosilane ($H_2SiCl_2$) is introduced at 20 sccm and HCl is added. An inert carrier gas (He) is also introduced at 10 slm, as well as an etchant (HCl). The HCl etchant is ramped up to a flow rate of approximately 200 sccm. In addition, several gases are introduced but are vented (denoted in Table B by a "V" following the flow rate) and flow straight to a vacuum pump to stabilize flow prior to deposition, including trisilane ($Si_3H_8$), monomethyl silane (MMS), phosphine ($PH_3$) and germane ($GeH_4$).

After the pre-deposition stage, a deposition phase takes place for approximately 3.6 seconds. During the deposition phase, trisilane flows with the He carrier gas to deposit epitaxial material. In addition, monomethyl silane (MMS) and phosphine ($PH_3$) flow at a rate of approximately 60 sccm and 150 sccm, respectively, during the deposition phase, resulting in the deposition of a phosphorous-doped, carbon-doped silicon epitaxial layer. During the deposition phase, the HCl etchant, which was first introduced during the pre-deposition phase, continues to flow with germane.

Unlike the example in Table A, the illustrated embodiment includes one or more purging stages between deposition and etch. In the illustrated embodiment, two purge stages (purge stage 1 and purge stage 2) take place between the deposition and etch phases. During purge stage 1, which lasts approximately 3.6 seconds, the silicon source trisilane ($Si_3H_8$) is completely removed, while carbon-source monomethyl silane (MMS) and dopant source phospine ($PH_3$) continue to flow but are vented to maintain a stable flow. The inert carrier gas He, etchant HCl and germane ($GeH_4$) continue to flow. Purge stage 2, which occurs immediately after purge 1, lasts approximately 2.4 seconds. During purge stage 2, the He carrier gas is ramped down from 10 slm to 2 slm, while the germane is ramped up from approximately 3-6 sccm to approximately 50-100 sccm.

After purge stage 2, an etchant phase takes place that lasts for approximately 6 seconds. During the etchant phase, the inert carrier gas HCl flows continuously with germane to selectively remove non-epitaxial material or epitaxial material of low quality. During the etchant phase, the HCl etchant continues to flow at approximately 200 sccm, the germane flows at between 50 and 100 sccm and the He carrier gas flows for approximately 2 slm. Together, the deposition and etch phases comprise a single cycle which can be repeated.

Following the etch phase, two additional purge stages (purge stage 3 and purge stage 4) take place. During purge stage 3 or 4, trisilane can be reestablished to vent at approximately 100 mg/min. In addition, the germane flow rate is ramped down from approximately 50-100 sccm to approximately 3-6 sccm. Immediately following purge stage 3 is purge stage 4, in which the He inert carrier gas is ramped back up to 10 slm, and a further cycle of deposition and etch is ready to take place. In some embodiments, after purge stage 4, there is a transition period of two seconds or less that returns back to the deposition period. The deposition and etch cycle can be repeated 30 times until a desired thickness of epitaxial material is formed.

It will be apparent to those skilled in the art that various modifications and variations can be made in the present invention without departing from the scope or spirit of the invention. Thus, it is intended that the present invention cover the modifications and variations of this invention provided that they come within the scope of the appended claims or their equivalents.

What is claimed is:

1. A method for selectively forming silicon-containing material in a recess, comprising:

providing a substrate, the substrate including a recess and insulating surfaces;

introducing a pulse of a silicon-containing source vapor to deposit silicon-containing material in the recess;

introducing a continuous etchant flow of one or more vapor-phase etchants to remove portions of the deposited silicon-containing material from the recess; and under isobaric conditions, repeating pulses of the silicon-containing source vapor during the continuous etchant flow to selectively form the silicon-containing material in the recess.

2. The method of claim 1, wherein introducing a pulse of a silicon-containing source vapor is conducted between 2.4 and 12 seconds.

3. The method of claim 1, wherein introducing a pulse of a silicon-containing source vapor is conducted between 20 and 100 times.

4. The method of claim 1, wherein the silicon-containing source vapor is selected from $Si_3H_8$, $Si_2H_6$, $Si_2H_5Cl$, $Si_2H_4Cl_2$, or 2,2-$Si_3H_6Cl_2$.

5. The method of claim 1, wherein the silicon-containing source has a flow rate between 50 and 200 sccm.

6. The method of claim 1, wherein the one or more vapor-phase etchants are introduced continuously for between 2.4 and 30 seconds.

7. The method of claim 1, further comprising using a $H_2$ carrier gas during the continuous etchant flow.

8. The method of claim 7, wherein the $H_2$ flow rate is between 1 slm and 20 slm.

9. The method of claim 1, wherein the etchant is $Cl_2$.

10. The method of claim 9, wherein the $Cl_2$ flow rate is between 5 sccm and 200 sccm.

11. The method of claim 1, wherein the vapor-phase etchant flow rate is held constant.

12. The method of claim 1, wherein the deposition caused by each pulse of silicon-containing vapor results in no deposition on the insulating surfaces.

13. The method of claim 1, wherein the continuous etchant flow results in removal of deposited silicon-containing material from recess sidewalls in between pulses of the silicon-containing source vapor.

14. The method of claim 1, wherein repeating pulses of the silicon-containing vapor results in a bottom-up growth of an epitaxial layer.

15. The method of claim 14, wherein the bottom-up growth of the epitaxial layer is between 1 nm and 3 nm per pulse.

* * * * *

UNITED STATES PATENT AND TRADEMARK OFFICE
CERTIFICATE OF CORRECTION

PATENT NO. : 8,367,528 B2
APPLICATION NO. : 12/620488
DATED : February 5, 2013
INVENTOR(S) : Bauer et al.

It is certified that error appears in the above-identified patent and that said Letters Patent is hereby corrected as shown below:

In the Specification

In column 5, line 56, please change "HI" to -- HI. --.

In column 9, line 57, please change "trisylmethane" to -- trisilylmethane --.

In column 17, line 10, please change "phospine" to -- phosphine --.

Signed and Sealed this
Twenty-ninth Day of October, 2013

Teresa Stanek Rea
*Deputy Director of the United States Patent and Trademark Office*